United States Patent
Chiu

(10) Patent No.: US 11,456,206 B2
(45) Date of Patent: Sep. 27, 2022

(54) SEMICONDUCTOR STRUCTURE AND METHOD OF MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/936,194

(22) Filed: Jul. 22, 2020

(65) Prior Publication Data

US 2022/0028736 A1     Jan. 27, 2022

(51) Int. Cl.
*H01L 21/768*     (2006.01)
*H01L 23/528*     (2006.01)

(52) U.S. Cl.
CPC .. *H01L 21/76816* (2013.01); *H01L 21/76832* (2013.01); *H01L 21/76877* (2013.01); *H01L 23/528* (2013.01)

(58) Field of Classification Search
CPC ......... H01L 21/76816; H01L 21/76832; H01L 21/76877; H01L 23/528
See application file for complete search history.

(56) References Cited

U.S. PATENT DOCUMENTS

| | | | | |
|---|---|---|---|---|
| 7,037,774 B1 * | 5/2006 | Syau | ................. | H01L 21/76816 257/E21.507 |
| 2003/0022486 A1 * | 1/2003 | Wu | ................... | H01L 21/76877 257/E21.585 |
| 2018/0174904 A1 * | 6/2018 | Hsieh | .................... | H01L 29/785 |
| 2020/0043721 A1 | 2/2020 | Liou et al. | | |

FOREIGN PATENT DOCUMENTS

| | | |
|---|---|---|
| TW | 202002170 A | 1/2020 |
| TW | 202023020 A | 6/2020 |

OTHER PUBLICATIONS

Office Action dated Apr. 18, 2022 from corresponding TW Application 110122428, with English translation, 5 pages.

\* cited by examiner

*Primary Examiner* — Shahed Ahmed
*Assistant Examiner* — Vicki B. Booker
(74) *Attorney, Agent, or Firm* — Muncy, Geissler, Olds & Lowe, P.C.

(57) ABSTRACT

The present disclosure provides a semiconductor structure with a reduced pitch (half-pitch feature) and a method of manufacturing the same. The semiconductor structure includes a substrate, a dielectric layer, at least one main feature, at least one first conductive feature, at least one first spacer, a plurality of second conductive features, and a plurality of second spacers. The dielectric layer is disposed on the substrate. The main feature is disposed in the dielectric layer and contacting the substrate. The first conductive feature is disposed in the dielectric layer and on the main feature. The first spacer is interposed between the dielectric layer and a portion of the first conductive feature. The second conductive features are disposed in the dielectric layer and on either side of the first conductive feature. The second spacers are interposed between the dielectric layer and portions of the second conductive features.

13 Claims, 27 Drawing Sheets

SEMICONDUCTOR STRUCTURE AND METHOD OF MANUFACTURING THE SAME

TECHNICAL FIELD

The present disclosure relates generally to a semiconductor structure and, more particularly, to a semiconductor structure with a half-pitch feature and a method of manufacturing the same.

DISCUSSION OF THE BACKGROUND

Photolithography is one of the basic processes used in manufacturing integrated circuit (IC) products. In photolithographic systems, there is a need to achieve a high resolution in order to resolve fine, high density, high-resolution patterns. Conventionally, the feature sizes and pitches (spacing between features) in IC products were minimized such that a desired pattern could not be formed using a single patterned photoresist layer.

However, as IC technologies continue to advance, device dimensions and pitches have been reduced to the technology node where existing photolithography tools, e.g., 193 nm wavelength photolithography tools, cannot form single patterned mask layers with all of the features of the overall target pattern. Without the use of advanced photolithography tools such as an extreme ultraviolet (EUV) scanner, semiconductor structures with small pitches are difficult to fabricate. Accordingly, designers have resorted to techniques that involve performing multiple exposures to define a specific pattern in a layer of material. One such technique is referred to as multiple patterning. Generally, multiple patterning is an exposure method that involves splitting (i.e., dividing or separating) a dense overall target circuit pattern into two separate, less-dense patterns.

The multiple patterning technique can effectively lower the complexity of the photolithography process and improve the achievable resolution without the use of more advanced photolithography tools.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure mainly includes a substrate, a dielectric layer, at least one main feature, at least one first spacer, a plurality of second conductive features, and a plurality of second spacers. The dielectric layer is disposed on the substrate. The feature is disposed in the dielectric layer and contacting the substrate. The first conductive feature is disposed in the dielectric layer and on the main feature. The first spacer is interposed between the dielectric layer and a portion of the first conductive feature. The second conductive features are disposed in the dielectric layer and on either side of the first conductive feature. The second spacers are interposed between the dielectric layer and portions of the second conductive features.

In some embodiments, the first conductive feature is centrally positioned on the main feature.

In some embodiments, the dielectric layer comprises a plurality of first dielectric features on the substrate and on either side of the main feature, wherein a first pitch equals the distance between centerlines of two adjacent first dielectric features, a second pitch equals the distance from one of the first conductive features to a nearest second conductive feature plus a width of one of the first or second conductive features, and the second pitch is half of the first pitch.

In some embodiments, the first dielectric features and the main features have an identical first width, which is equal to half of the first pitch.

In some embodiments, the semiconductor structure further comprises a first stop layer covering the first dielectric features and a portion of the main features, wherein the first stop layer surrounds portions of the first conductive features, and the first spacers are located on the first stop layer and cover portions of the first conductive features above the first stop layer.

In some embodiments, the dielectric layer further comprises a plurality of second dielectric features on the first stop layer.

In some embodiments, the second dielectric features, the first spacers and the first conductive features have coplanar top surfaces that form a first planar top surface.

In some embodiments, the semiconductor structure further comprises a second stop layer on the first planar top surface, wherein portions of the second conductive features are surrounded by the second stop layer.

In some embodiments, the dielectric layer further comprises a plurality of third dielectric features on the second stop layer.

In some embodiments, the second spacers are located on the second stop layer and cover sidewalls of the third dielectric features.

In some embodiments, the third dielectric features, the second spacers and the second conductive features have coplanar top surfaces that form a second planar top surface.

In some embodiments, the first conductive feature extends into the main feature.

In some embodiments, the first spacer and the second spacer have identical thicknesses.

In some embodiments, the first conductive feature and the second conductive features have an identical width.

Another aspect of the present disclosure provides method of fabricating the semiconductor structure. The method includes steps of forming a plurality of main features on a substrate; forming a first dielectric layer on the substrate, wherein the first dielectric layer includes a plurality of first dielectric features on either side of the main features; forming a first stop layer on the first dielectric features and the main features; forming a second dielectric layer on the first stop layer, where the second dielectric layer includes a plurality of second dielectric features over the first dielectric features; forming a plurality of first spacers on sidewalls of the second dielectric features; forming a plurality of first openings penetrating through portions of the first stop layer not covered by the second dielectric layer and the first spacers; forming a plurality of first conductive features in the first openings and contacting the main features; forming a second stop layer covering the second dielectric features, the first spacers and the first conductive features; forming a plurality of third dielectric features over the second spacers and the first conductive features; forming a plurality of second spacers on sidewalls of the third dielectric features; removing portions of the second stop layer not covered by the third dielectric features and the second spacers to form a plurality of second openings to expose portions of the second dielectric features; removing portions of the second dielectric features not covered by the second stop layer and the second spacers to form a plurality of third openings; and forming a plurality of second conductive features in the second openings, the third openings and a plurality of fourth openings between adjacent second spacers.

In some embodiments, the formation of the main feature comprises steps of forming a main layer on the substrate; forming a first photoresist pattern on the main layer; and removing portions of the main layer exposed through the first photoresist pattern to form the plurality of main features.

In some embodiments, the formation of the second dielectric features comprises steps of forming a second dielectric layer on the first stop layer; forming a second photoresist pattern on the second dielectric layer; and removing portions of the second dielectric layer exposed through the second photoresist pattern to form the plurality of second dielectric features; the formation of the third dielectric features comprises steps of forming a third dielectric layer on the second stop layer; forming a third photoresist pattern on the third dielectric layer; and removing portions of the third dielectric layer exposed through the third photoresist pattern to form the plurality of third dielectric features the formation of the first photoresist pattern and the formation of the third photoresist pattern comprise using a first photomask, and the formation of the second photoresist pattern comprises using a second photomask, which is a reverse-tone photomask of the first photomask.

In some embodiments, the first openings extend into the main features.

In some embodiments, the formation of the first spacers comprises steps of depositing a first spacer layer on the second dielectric features and portions of the first stop layer exposed through the second dielectric features; and removing horizontal portions of the first spacer layer, wherein the formation of the first openings is simultaneous with the removal of the horizontal portions of the first spacer layer.

In some embodiments, the formation of the second spacers comprises steps of depositing a second spacer layer on the third dielectric features and portions of the second stop layer exposed through the third dielectric features; and removing horizontal portions of the second spacer layer, wherein the formation of the second openings is simultaneous with the removal of the horizontal portions of the second spacer layer.

Interconnect structures with tight pitches are difficult to fabricate, especially when the pitch is less 75 nm. The present disclosure provides a multi-patterning method that can drive the pitch of a semiconductor structure down and fabricate a tight-pitch semiconductor structure. The present disclosure uses a first photomask in the first and third lithography processes and a second photomask, which is reverse-tone to the first photomask, in the second lithography process. In addition, the present disclosure uses spacers as a hard mask and controls the thickness of the spacers to adjust the width of conductive features. Therefore, given the pitch defined by two proximal main features, e.g., gate structures, the final pitch, which is defined by two proximal conductive features, e.g., metal lines, can be halved, resulting in a reduced minimum feature size.

The foregoing has outlined rather broadly the features and technical advantages of the present disclosure in order that the detailed description of the disclosure that follows may be better understood. Additional features and technical advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
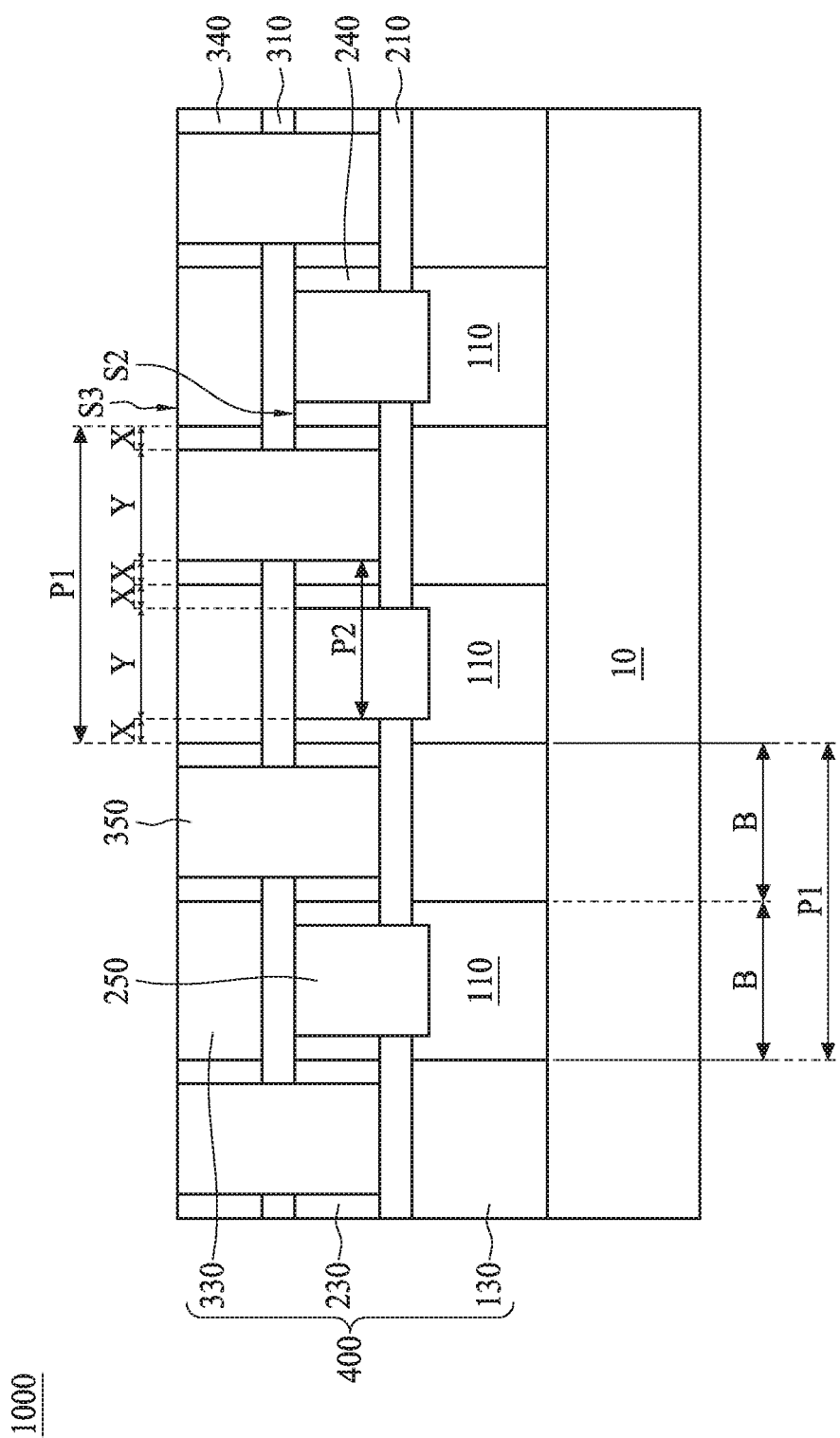
FIG. 1 is a schematic cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of some embodiments apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "includes" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of a semiconductor structure 1000, in accordance with some embodiments of the present disclosure. With reference to FIG. 1, the semiconductor structure 1000 primarily includes a substrate 10, one or more main features 110, one or more first dielectric features 130, one or more second dielectric features 230, one or more third dielectric features 330, one or more first conductive features 250, one or more second conductive features 350, one or more first spacers 240, one or more second spacers 340, a first stop layer 210 and a second stop layer 310. The main features 110 and the first dielectric features 130 are alternately arranged on the substrate 10. A first pitch P1 is present such that the first pitch P1 equals the distance from one of the main features 110 to an adjacent main feature 110. The first conductive features 250 are located on the main features 110, wherein a portion of each first conductive feature 250 is surrounded by one of the first spacers 240. Each of the first conductive features 250 is centrally located on the top of one of the main features 110, and a portion of the first conductive feature 250 not surrounded by the first spacer 240 extends into the main feature 110. The first stop layer 210 covers the main features 110 and portions of the first dielectric layer 130 exposed through the first conductive features 250.

The second dielectric features 230, the first spacers 240 and the second conductive features 350 are located on the first stop layer 210, wherein the first spacers 240 cover portions of sidewalls of the first conductive features 250. Each of the second conductive features 350 is partially surrounded by the second spacers 340 and centrally positioned over the top of each of the first dielectric features 130. A second pitch P2 is present such that the second pitch P2 equals the distance from one of the first conductive features 250 to a nearest second conductive feature 350 plus the width of the first conductive feature 250. The second pitch P2 is half of the first pitch P1. Each of the first dielectric features 130 and each of the main features 110 have an identical first width, which is equal to half of the first pitch P1. The first spacers 240 and the second spacers 340 have an identical thickness X. Each of the first conductive features 250 and each of the second conductive features 350 have an identical width Y. The second dielectric features 230, the first spacers 240 and the first conductive features 250 have coplanar top surfaces that form a second planar top surface S2. The second stop layer 310 is on the top surface S2, wherein the second stop layer 310 surrounds a portion of each of the second conductive features 350. A portion of the first stop layer 210 is interposed between the first dielectric features 130 and the second dielectric features 230 and another portion of the first stop layer 210 is interposed between the first spacers 240 and the main features 110. The third dielectric features 330 are located on the second stop layer 310. The second spacers 340 are located on the second stop layer 310 and cover sidewalls of the third dielectric features 330. The third dielectric features 330, the second spacers 340 and the second conductive features 350 have coplanar top surfaces that form a third planar top surface S3.

A portion of the second stop layer 310 is interposed between the second spacers 340 and the second dielectric features 230, another portion of the second stop layer 310 is interposed between the third dielectric features 330 and the first spacers 240, and a remaining portion of the second stop layer 310 is interposed between the third dielectric features 330 and the first conductive features 250. Each of the second conductive features 350 is substantially located between any two of the first conductive features 250. The first dielectric features 130, the second dielectric features 230, and the third dielectric features 330 compose a dielectric layer 400 in which the main features 110, the first conductive features 250, the first spacers 240, and the first and second stop layers 210 and 310 are buried, and in which the second conductive features 350 and the second spacers 340 are disposed.

Figure 2:
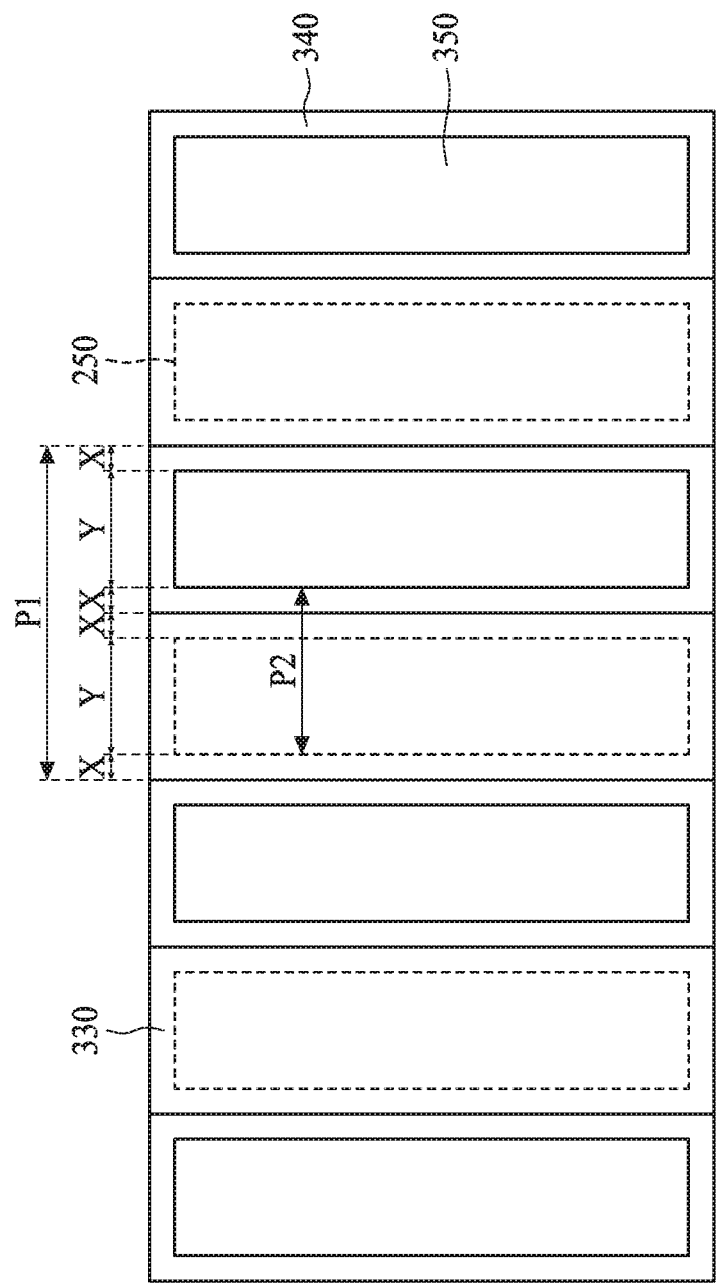
FIG. 2 is a schematic top view of the semiconductor structure in FIG. 1 in accordance with some embodiments of the present disclosure.

FIG. 2 is a schematic top view of the semiconductor structure 1000, in accordance with some embodiments of the present disclosure. With reference to FIGS. 1 and 2, the first pitch P1 equals 4X+2Y, which is the distance between two proximal main features 110 plus the width of the main feature 110. In some embodiments, the first pitch P1 equals the distance between centerlines of two proximal main features 110. The second pitch P2 equals 2X+Y, which is the distance between two proximal conductive features 250 and 350 plus the width of the conductive feature 250 or 350. The second pitch P2 is half of the first pitch P1.

Figure 3:
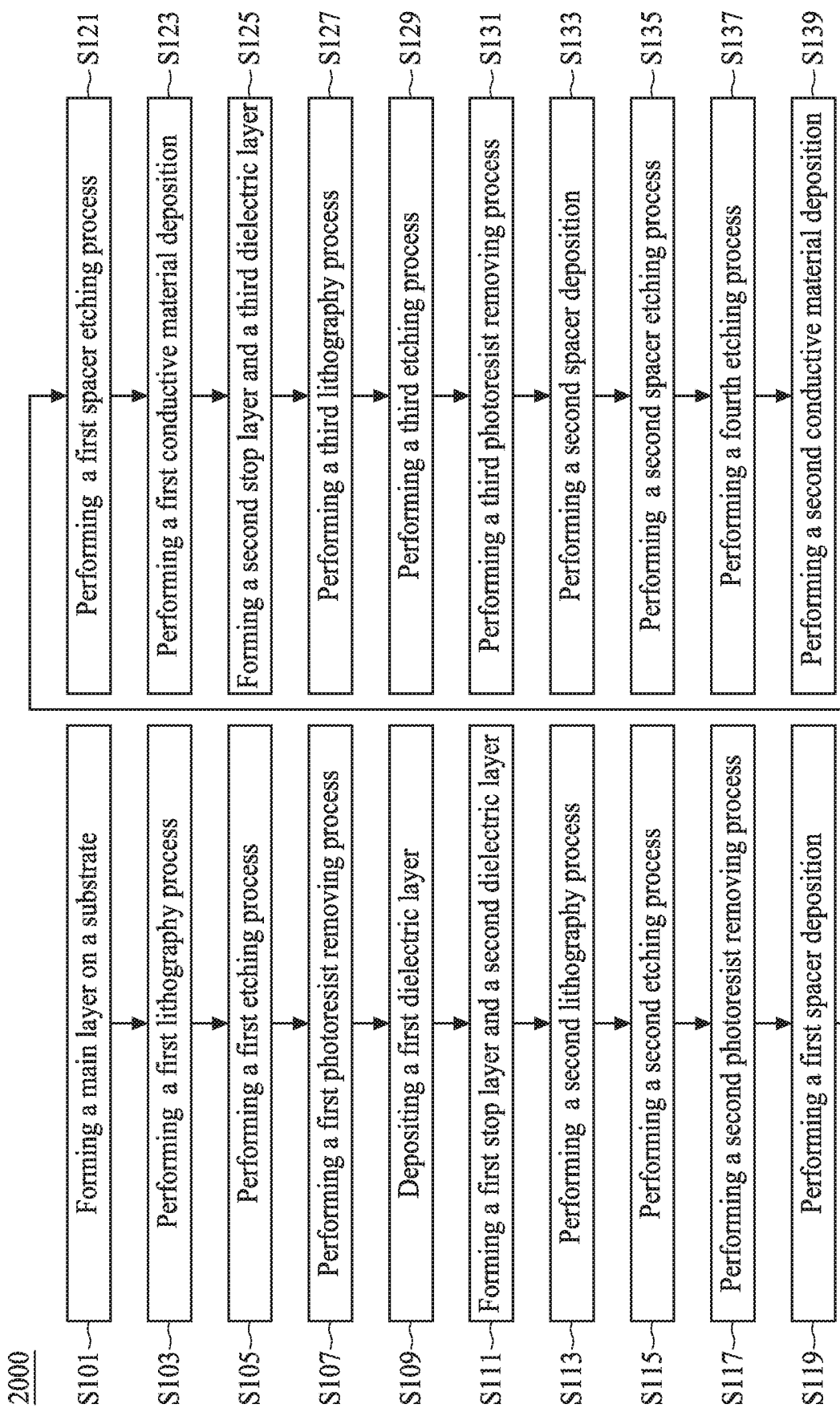
FIG. 3 is a flowchart showing a method of fabricating a semiconductor structure in accordance with some embodiments of the present disclosure.

FIG. 3 is a flow diagram showing a method 2000 for fabricating the semiconductor structure 1000 in FIG. 1, in accordance with some embodiments of the present disclosure. Specifically, the method 2000 includes a multi-patterning process. FIGS. 4 to 27 are schematic cross-sectional views showing sequential fabrication stages according to the method 2000, in accordance with some embodiments of the present disclosure.

Figure 4:
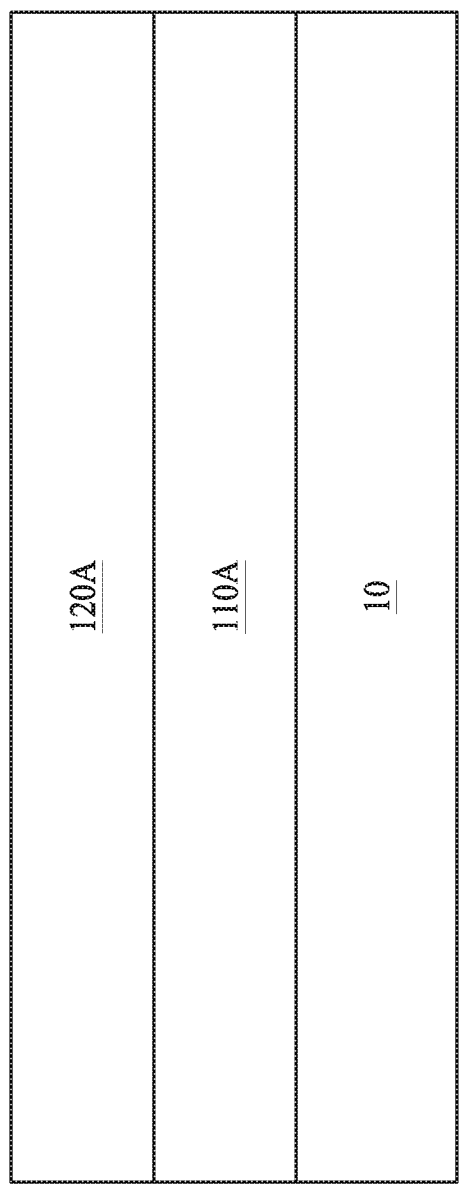
FIGS. 4 to 27 are cross-sectional views of the semiconductor structure at various stages of manufacture in accordance with some embodiments of the present disclosure.

With reference to FIG. 4, a main layer 110A is formed on a substrate 10 according to step S101 in FIG. 3. In some embodiments, the substrate 10 may be a dielectric material, such as silicon oxide and/or a low dielectric-constant (low-k) material. In such embodiments, the substrate 10 may be formed using a spin-coating process or a chemical vapor deposition (CVD) process. In alternative embodiments, the substrate 10 may mainly include silicon, dielectric material, conductive material or a combination thereof. In such embodiments, the substrate 10 may include various doped regions, dielectric features or multilevel interconnects. In some embodiments, the main layer 110A may include polysilicon or other suitable materials. In some embodiments, the main layer 110A may be formed using a CVD process.

Figure 5:
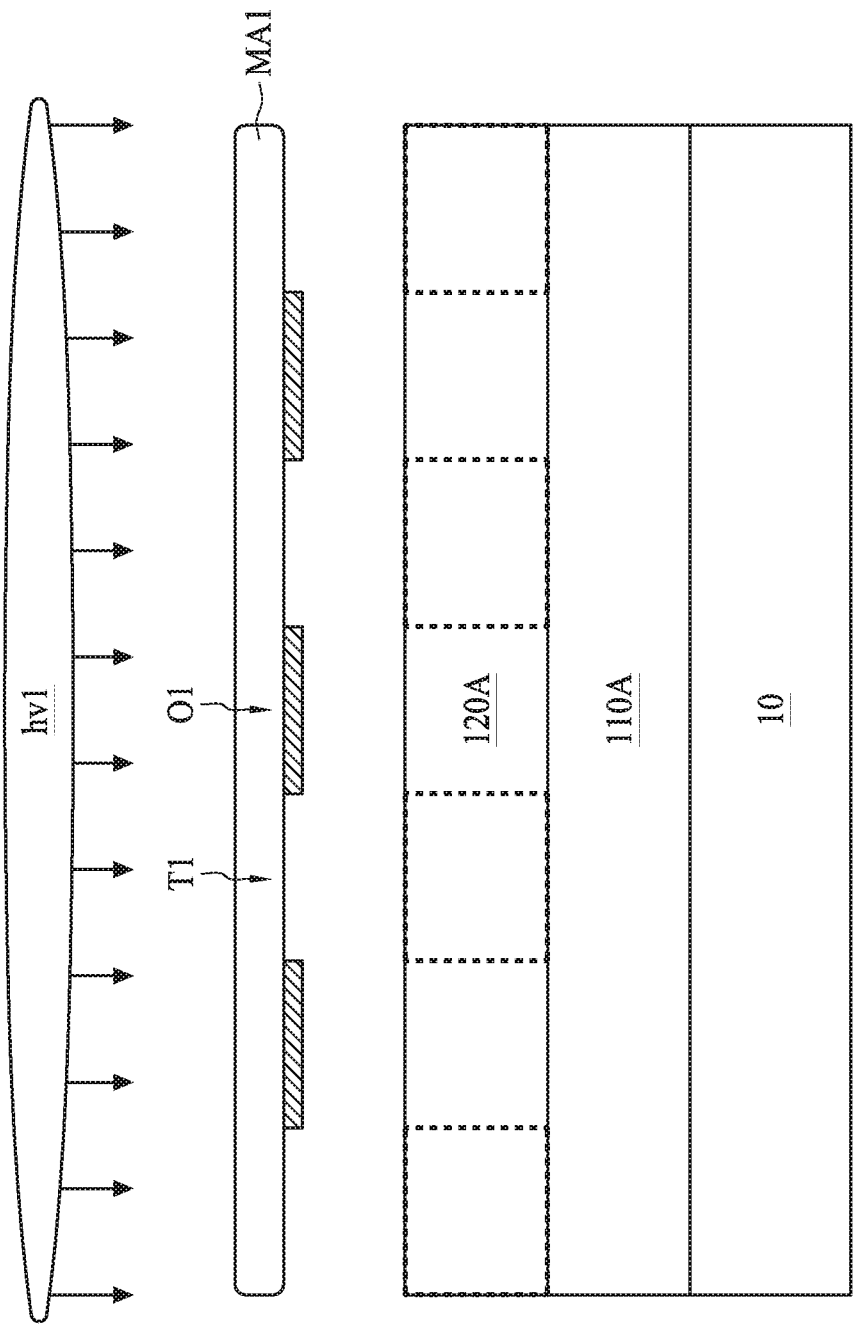

With reference to FIGS. 4 and 5, a first lithography process is performed according to step S103 in FIG. 3. First, referring to FIG. 4, a first photoresist layer 120A is deposited to completely cover the main layer 110A. In some embodiments, the first photoresist layer 120A may be a positive tone photoresist (positive photoresist), which is characterized by removal of exposed regions using a developing solution. In some embodiments, the first photoresist layer 120A includes chemical amplifier (CA) photoresist. The CA photoresist includes a photoacid generator (PAG) that can be decomposed to form acids during a lithography exposure process. More acids can be generated as a result of a catalytic reaction.

Referring to FIG. 5, the first photoresist layer 120A is exposed to a first radiation hv1 using a first photomask MA1 and a lithography system. In some embodiments, the first radiation hv1 may include, but is not limited to, deep ultraviolet (DUV) light. The first photomask MA1 includes multiple first transparent portions T1 and multiple first opaque portions O1. In some embodiments, the first transparent portion T1 and the first opaque portion O1 are equal in horizontal length. The exposure induces a photochemical reaction that changes the chemical property of portions of the first photoresist layer 120A. For example, the portions of the first photoresist layer 120A corresponding to the first transparent portions T1 are exposed and become more reactive to a developing process. In some embodiments, a post-exposure baking (PEB) process may be performed after the first photoresist layer 120A is exposed.

Figure 6:
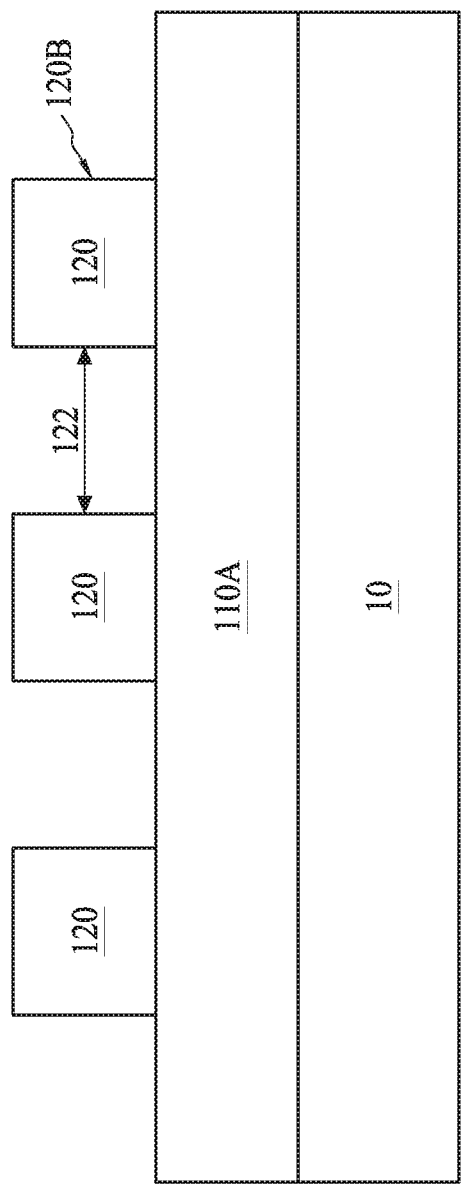

Subsequently, referring to FIG. 6, an appropriate developing solution is used to rinse the exposed portions of the first photoresist layer 120A. The exposed portion of the first photoresist layer 120A reacts with the developing solution and can be easily removed. After the developing process is finished, a first photoresist pattern 120B is formed on the main layer 110A. The first photoresist pattern 120B includes multiple first photoresist features 120 and multiple openings 122 arranged with the first photoresist features 120. In some embodiments, the first photoresist features 120 and the openings 122 respectively correspond to the first opaque portions O1 and the first transparent portions T1 of the first photomask MA1 shown in FIG. 5. A portion of the main layer 110A is covered by the first photoresist features 120.

Figure 7:
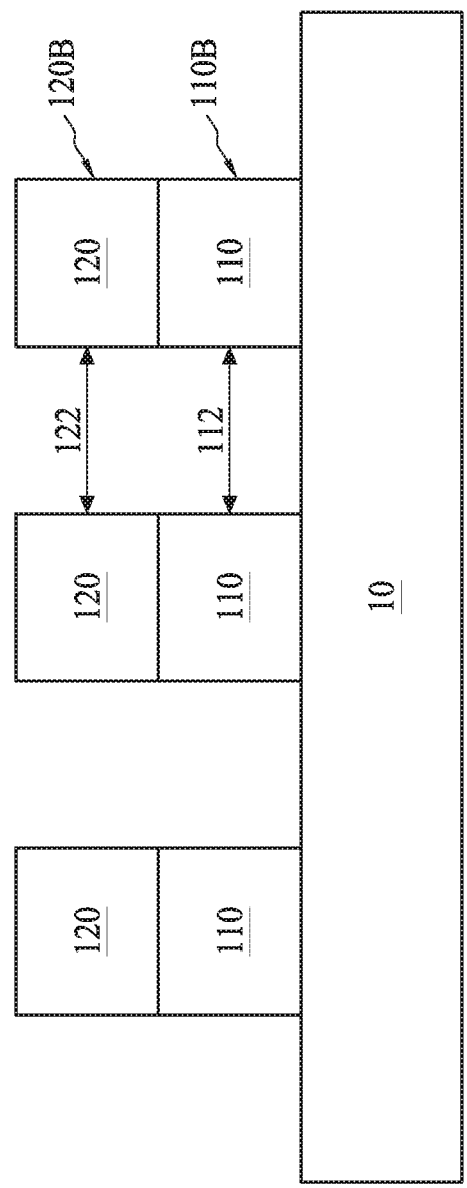

With reference to FIG. 7, a first etching process is performed according to step S105 in FIG. 3. In some embodiments, the main layer 110A is etched using the first photoresist pattern 120B as an etching mask. Specifically, the uncovered portion of the main layer 110A is removed by a first etchant (not shown) to expose portions of the substrate 10. As a result, a main pattern 110B comprising multiple main features 110 and multiple openings 112 is formed on the substrate 10. In some embodiments, the main feature 110 may be used as a gate structure in a transistor. In some embodiments, the main features 110 are connected to the first photoresist features 120 and the openings 112 communicate with the openings 122.

Figure 8:
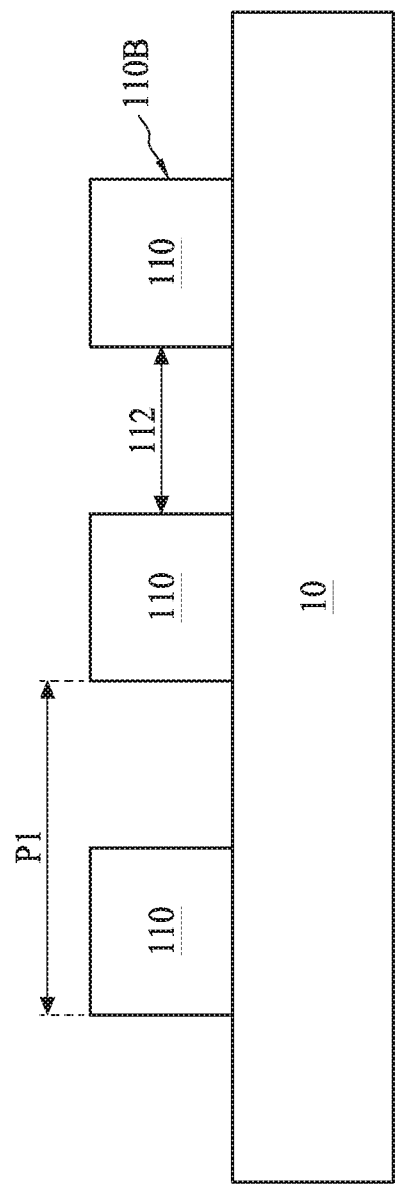

With reference to FIG. 8, a first photoresist removing process is performed according to step S107 in FIG. 3. After the first etching process is finished, the first photoresist pattern 120B may be removed by, for example, an ashing process or a wet strip process. In some embodiments, a first pitch P1 exists in the main pattern 110B, wherein the first pitch P1 is the distance between centerlines of two adjacent main features 110. In some embodiments, the first pitch P1 is defined according to a predetermined integrated circuit (IC) layout in the first photomask MA1.

Figure 9:
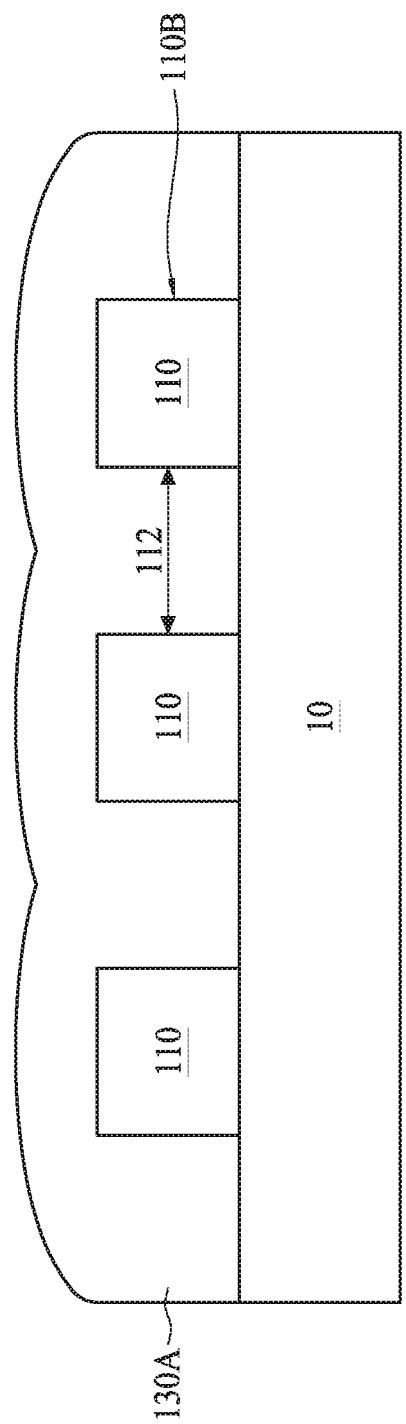

With reference to FIG. 9, a first dielectric layer 130A is deposited in the openings 112 according to step S109 in FIG. 3. Specifically, the first dielectric layer 130A is uniformly and conformally deposited to fill the openings 112 and completely cover the main features 110. In some embodiments, the first dielectric layer 130A may include the same material as the substrate 10. In some embodiments, the first dielectric layer 130A may be formed using a spin-coating process or a CVD process.

Figure 10:
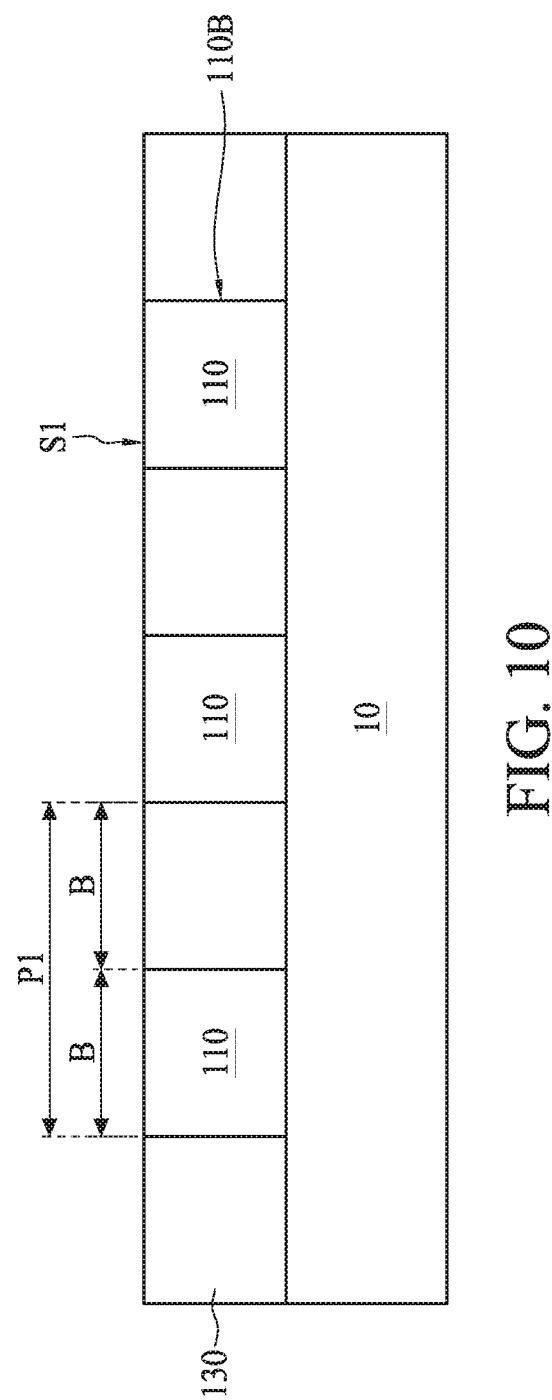

With reference to FIGS. 9 and 10, after the openings 112 are filled with the first dielectric layer 130A, a chemical mechanical planarization (CMP) process is performed to remove portions of the first dielectric layer 130A over the top surface of the main features 110. At such time, a plurality of first dielectric features 130 are formed. In some embodiments, the first dielectric feature 130 and the main feature 110 have an identical first width B because the first dielectric feature 130 and the main feature 110 respectively correspond to the first transparent portion T1 and the first opaque portion O1 in the first photomask MA1 shown in FIG. 5, wherein the first transparent portion T1 and the first opaque portion O1 are equal in horizontal length. In some embodiments, the first width B is equal to half of the first pitch P1, that is, P1=2B. In some embodiments, the first dielectric features 130 and the main features 110 have coplanar top surfaces that form a planar top surface S1.

Figure 11:
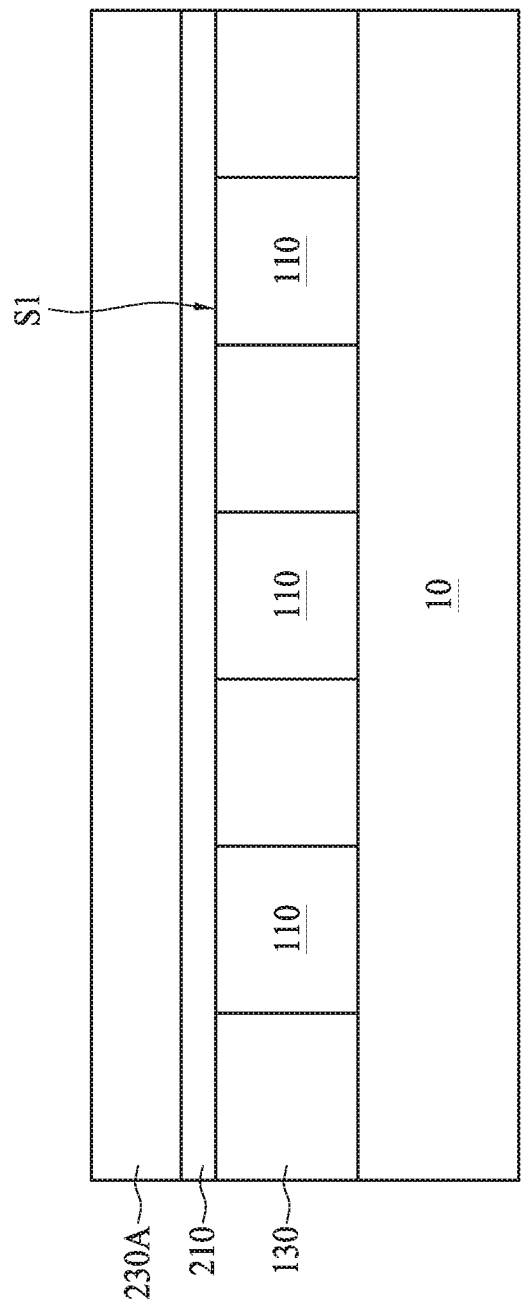

With reference to FIG. 11, a first stop layer 210 and a second dielectric layer 230A are formed on the top surface S1 according to step S111 in FIG. 3. In some embodiments, the first stop layer 210 may include silicon nitride (SiN), silicon oxynitride (SiON) or other suitable materials chosen for compatibility, but the disclosure is not limited thereto. In some embodiments, the first stop layer 210 may be formed using a plasma-enhanced chemical vapor deposition (PECVD) process. In some embodiments, the first stop layer 210 may serve as an etching stop layer to improve planarization. In some embodiments, the first stop layer 210 is thin, preferably less than 1000 Å (angstroms) thick, but the disclosure is not limited thereto. Still referring to FIG. 11, the second dielectric layer 230A is deposited to completely cover the first stop layer 210. In some embodiments, the second dielectric layer 230A may include the same material as the substrate 10. In some embodiments, the second dielectric layer 230A may be formed using a spin-coating process or a CVD process. A CMP process is performed to planarize the second dielectric layer 230A prior to the subsequent process.

Figure 12:
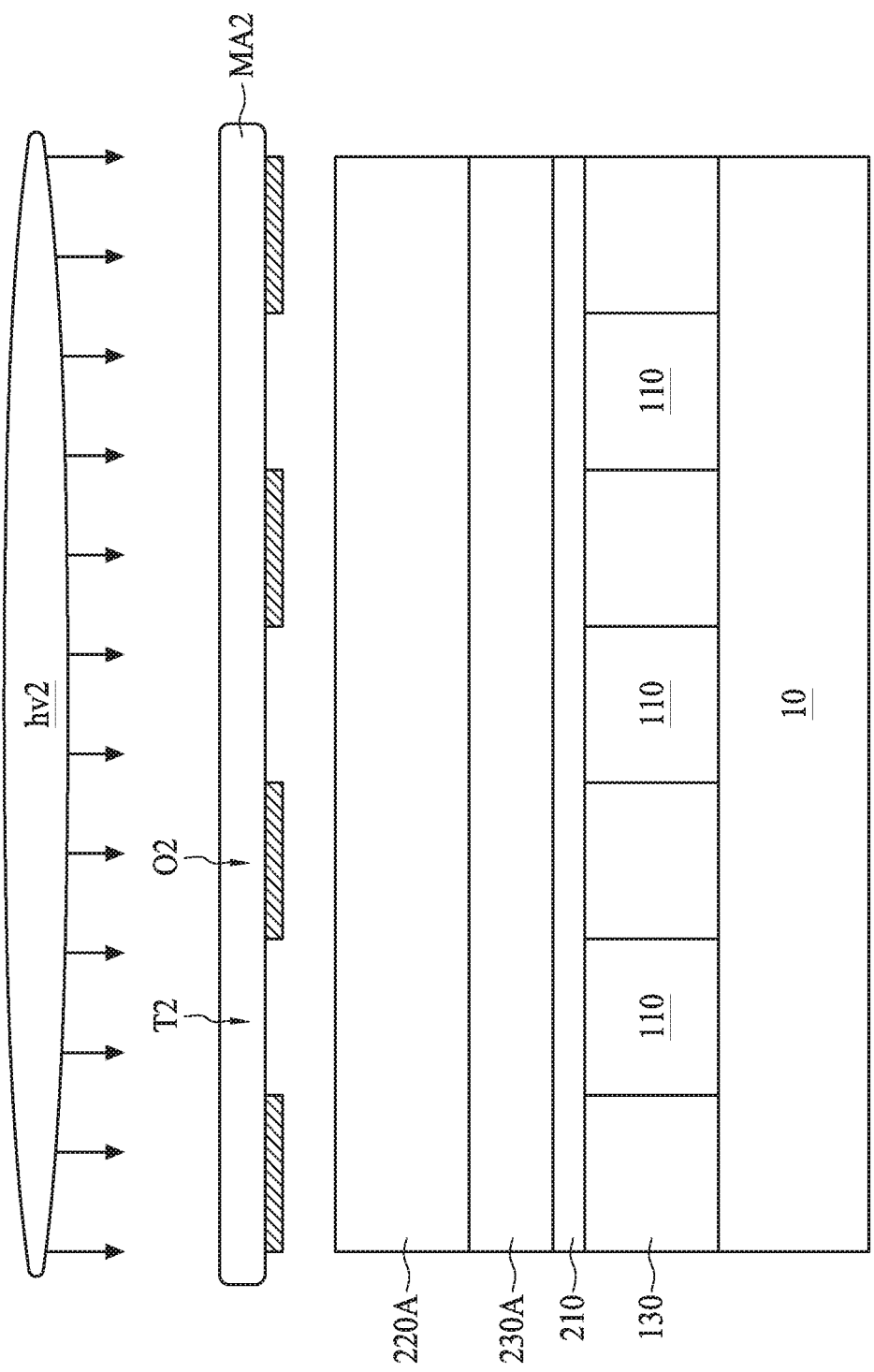
Figure 13:
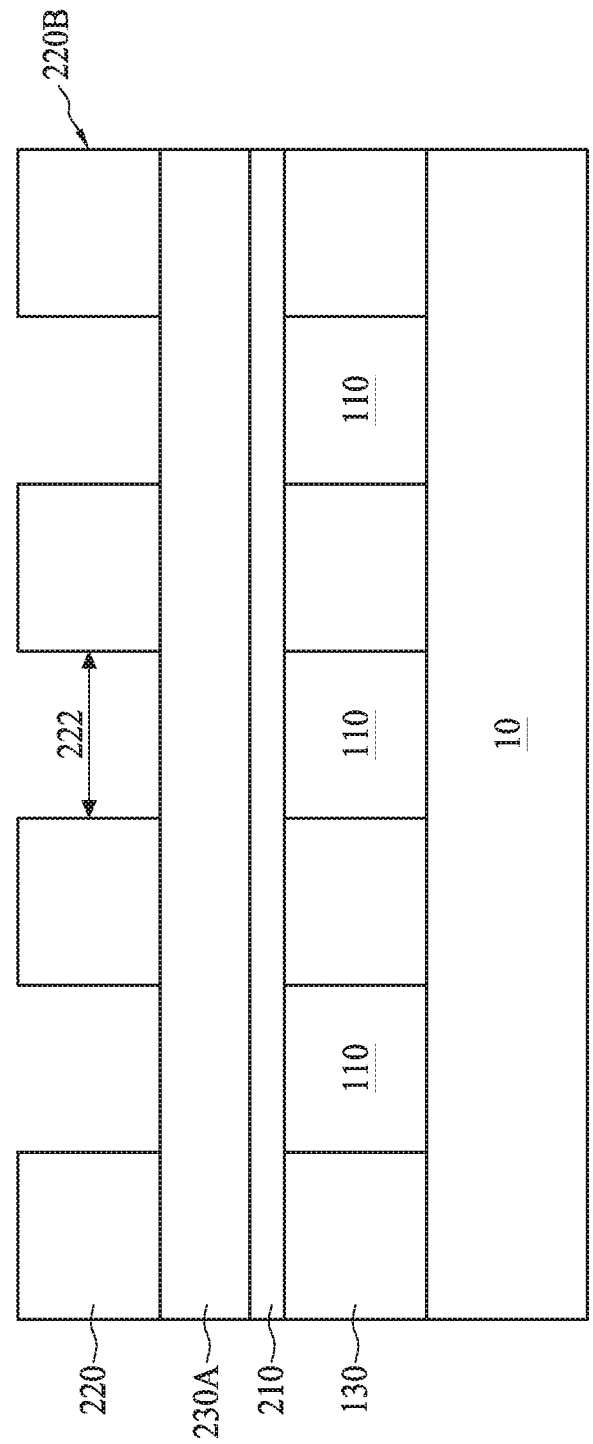

With reference to FIG. 12 and FIG. 13, a second lithography process is performed according to step S113 in FIG. 3. First, referring to FIG. 12, a second photoresist layer 220A is deposited to completely cover the second dielectric layer 230A. Next, the second photoresist layer 220A is exposed to a second radiation hv2 using a second photomask MA2 and a lithography system. In some embodiments, the second radiation hv2 may include, but is not limited to, deep ultraviolet (DUV) light. The second photomask MA2 includes multiple second transparent portions T2 and multiple second opaque portions O2. In some embodiments, the second transparent portion T2 and the second opaque portion O are equal in horizontal length. In some embodiments, the second photomask MA2 is a reverse-tone photomask of the first photomask MA1, that is, the arrangement of the second transparent portions T2 and the second opaque portions O2 is opposite to the arrangement of the first transparent portions T1 and the first opaque portions O1. The exposure induces a photochemical reaction that changes the chemical property of portions of the second photoresist layer 220A. In some embodiments, a PEB process may be performed after the second photoresist layer 220A is exposed.

Subsequently, referring to FIG. 13, an appropriate developing solution is used to rinse the exposed second photoresist layer 220A. The exposed portion of the second photoresist layer 220A reacts with the developing solution and can be easily removed. After the developing process is finished, a second photoresist pattern 220B is formed on the second dielectric layer 230A. The second photoresist pattern 220B includes multiple second photoresist features 220 and multiple openings 222 arranged with the second photoresist features 220. In some embodiments, the second photoresist features 220 and the openings 222 respectively correspond to the second opaque portions O2 and the second transparent portions T2 of the second photomask MA2 shown in FIG.

12. Portions of the second dielectric layer 230A are covered by the second photoresist features 220.

Figure 14:
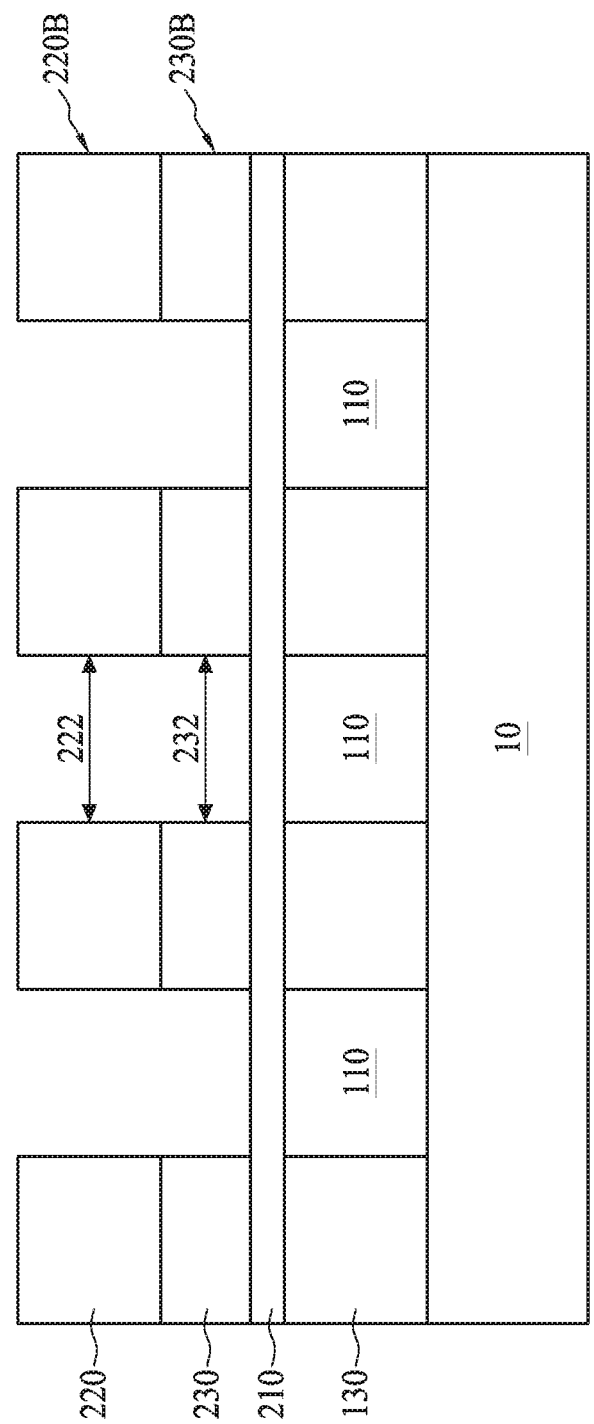

With reference to FIG. 14, a second etching process is performed according to step S115 in FIG. 3. In some embodiments, the second dielectric layer 230A is etched using the second photoresist pattern 220B as an etching mask. Specifically, the uncovered portions of the second dielectric layer 230A are removed by a second etchant (not shown) to expose portions of the first stop layer 210. In some embodiments, the second etchant may be the same as the first etchant. As a result, a second dielectric layer 230B comprising multiple second dielectric features 230 and multiple openings 232 is formed on the first stop layer 210. In some embodiments, the second dielectric features 230 are connected to the second photoresist features 220 and the openings 232 communicate with the openings 222.

Figure 15:
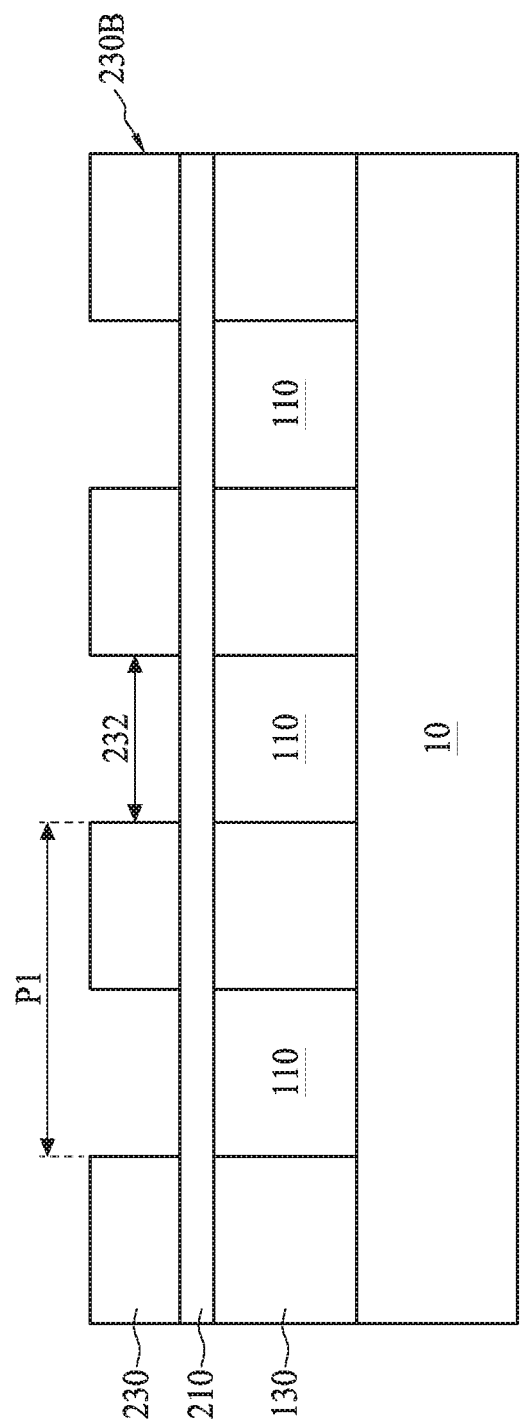

With reference to FIG. 15, a second photoresist removal process is performed according to step S117 in FIG. 3. After the second etching process is finished, the second photoresist pattern 220B may be removed. In some embodiments, the first pitch P1 exists in the second dielectric layer 230B, wherein the first pitch P1 equals the distance from one of the second dielectric features 230 to an adjacent second dielectric feature 230 plus the width of the second dielectric feature 230, because the second photomask MA2 is the reverse-tone photomask of the first photomask MA1.

Figure 16:
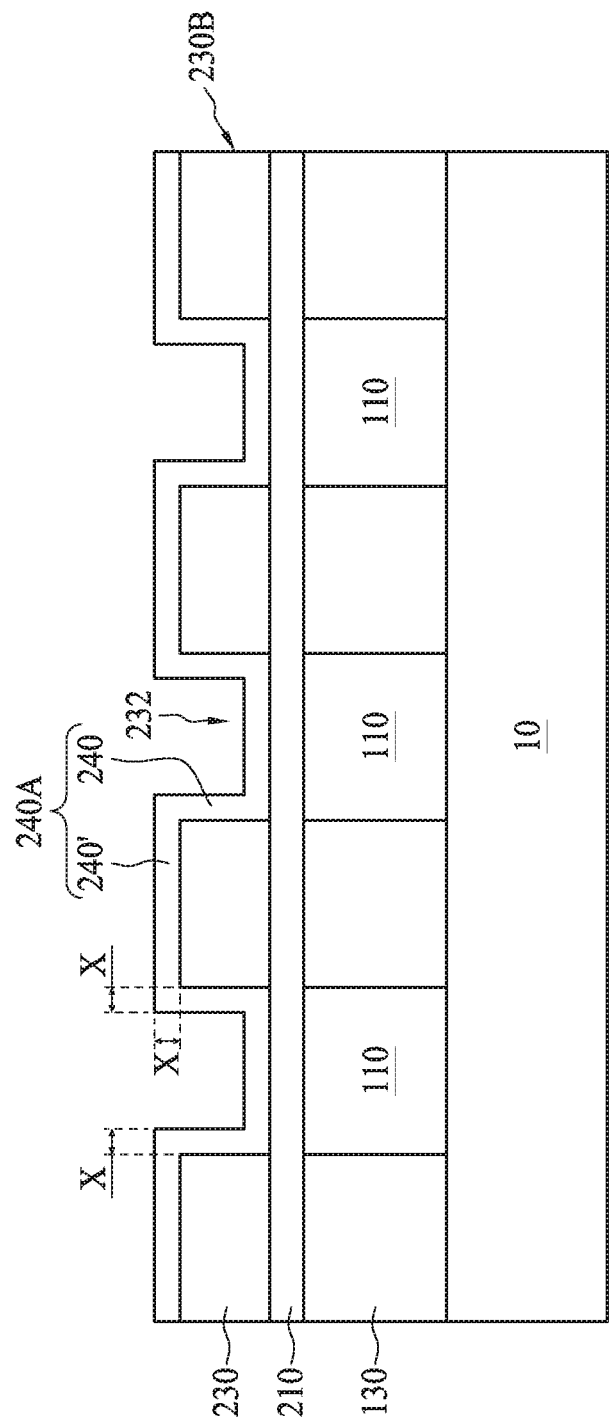

With reference to FIG. 16, a first spacer deposition is performed according to step S119 in FIG. 3. In some embodiments, a spacer layer 240A may be formed conformally on the second dielectric layer 230B and the first stop layer 210. In some embodiments, the spacer layer 240A may be formed using a CVD process or an atomic layer deposition (ALD) process. In some embodiments, the spacer layer 240A has a thickness X that is precisely controlled by the deposition condition. In some embodiments, the spacer layer 240A can include various dielectric materials having high dielectric-constant (high-k). For example, the dielectric layer can include silicon oxide (SiO), silicon nitride (SiN), silicon oxynitride (SiON), metal oxide such as hafnium oxide (HfO), or other suitable materials chosen for compatibility, but the disclosure is not limited thereto.

Figure 17:
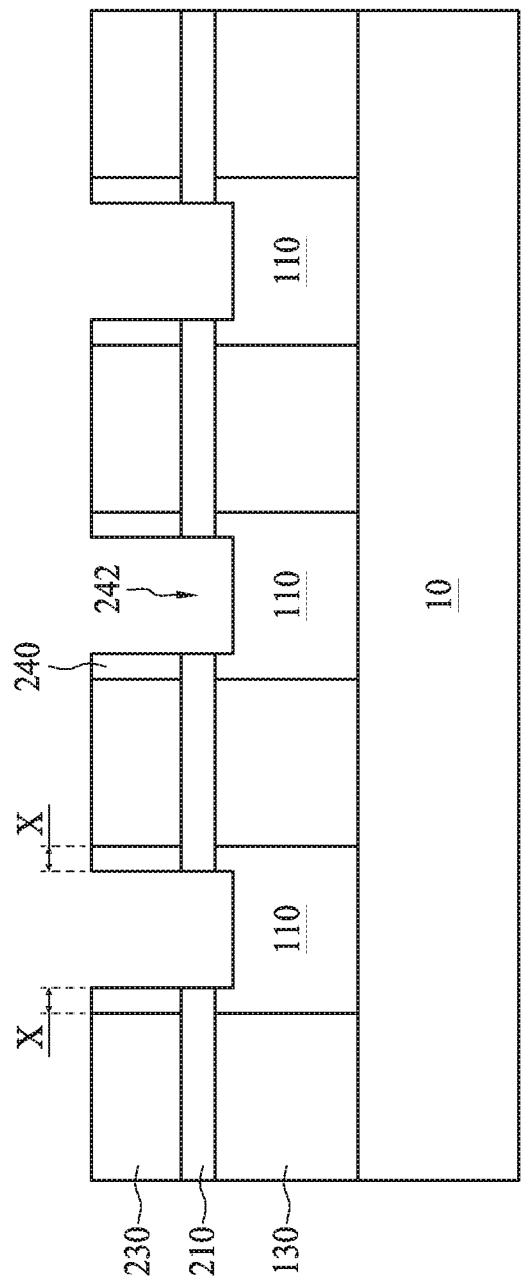

With reference to FIGS. 16 and 17, a first spacer etching process is performed according to step S121 in FIG. 3. In some embodiments, the first spacer etching is an anisotropic etching process that removes horizontal portions 240' of the spacer layer 240A and penetrates the first stop layer 210. As a result, multiple spacers 240 comprising the thickness X are left on the first stop layer 210 to cover sidewalls of the second dielectric features 230. In addition, during the first spacer etching process, the main features 110 are partially etched and multiple openings 242 are thereby formed. In some embodiments, portions of the first stop layer 210 are interposed between the first dielectric features 130 and the second dielectric features 230 and other portions of the first stop layer 210 are interposed between the spacers 240 and the main features 110.

Figure 18:
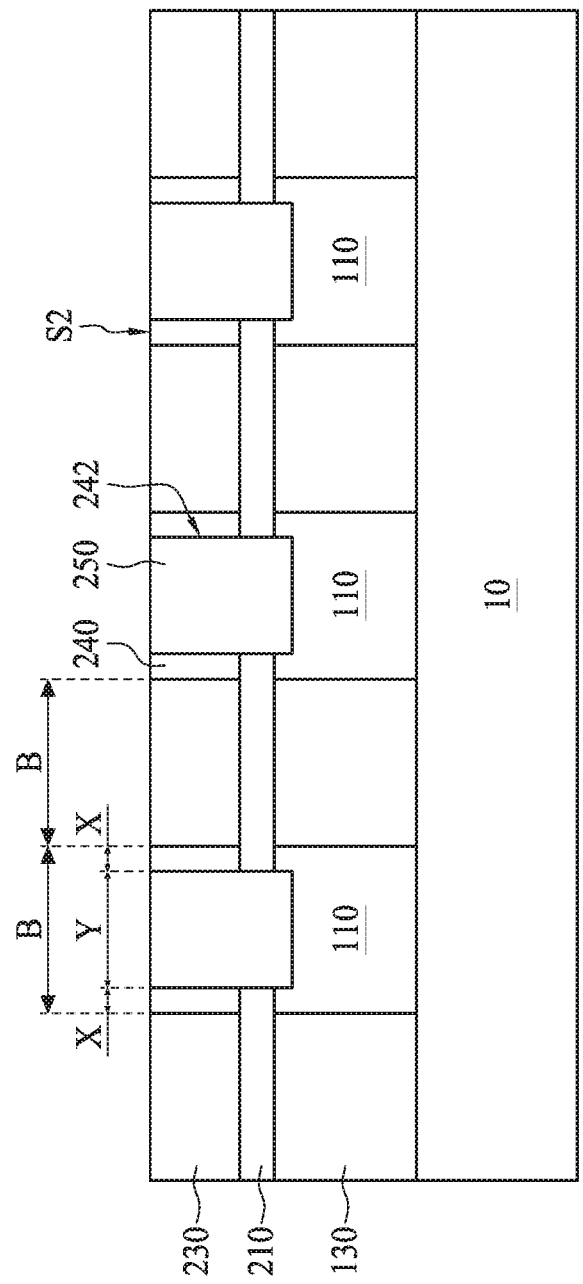

With reference to FIG. 18, a first conductive material deposition is performed according to step S123 in FIG. 3. In some embodiments, the first conductive material deposition is an electroplating process. Specifically, a first conductive material is deposited to fill the openings 242 and completely cover the second dielectric features 230 and the spacers 240. In some embodiments, the first conductive material may include a low-resistivity material such as copper or copper-based alloy. Alternatively, the first conductive material may include various materials such as tungsten (W), aluminum (Al), gold (Au), silver (Ag) and the like. After the openings 242 are completely filled with the first conductive material, a CMP process is performed to remove a portion of the first conductive material to expose the second dielectric features 230 and the spacers 240. At such time, multiple first conductive features 250 filling the openings 242 are formed. In some embodiments, each of the first conductive features 250 is surrounded by the spacers 240. In addition, the spacer 240 may be used as a hard mask to control the width of the openings 242 according to the thickness X of the spacer 240. Therefore, the thickness X of the spacer 240 may be used to adjust a width Y of the first conductive feature 250. For example, still referring to FIG. 18, the width Y of the first conductive feature 250 is equal to (B−2X), that is, B=(2X+Y). In some embodiments, the second dielectric features 230, the spacers 240 and the first conductive features 250 have coplanar top surfaces that form a planar top surface S2. In some embodiments, before the first conductive material is deposited, a diffusion barrier layer (not shown) may be conformally formed in the openings 232 and 242. The diffusion barrier layer, which lines the openings 232 and 242, functions as an isolation to prevent metal diffusion and as an adhesion layer between the first conductive material and dielectric materials. The material of the diffusion barrier layer includes TaN, Ta, Ti, TiN, TiSiN, WN, or a combination thereof. After the diffusion barrier layer is formed, a seed layer (not shown) is formed on the diffusion barrier layer. In some embodiments, when the first conductive material is a copper-containing material, the seed layer may be a copper seed layer formed by a physical vapor deposition (PVD) process.

Figure 19:
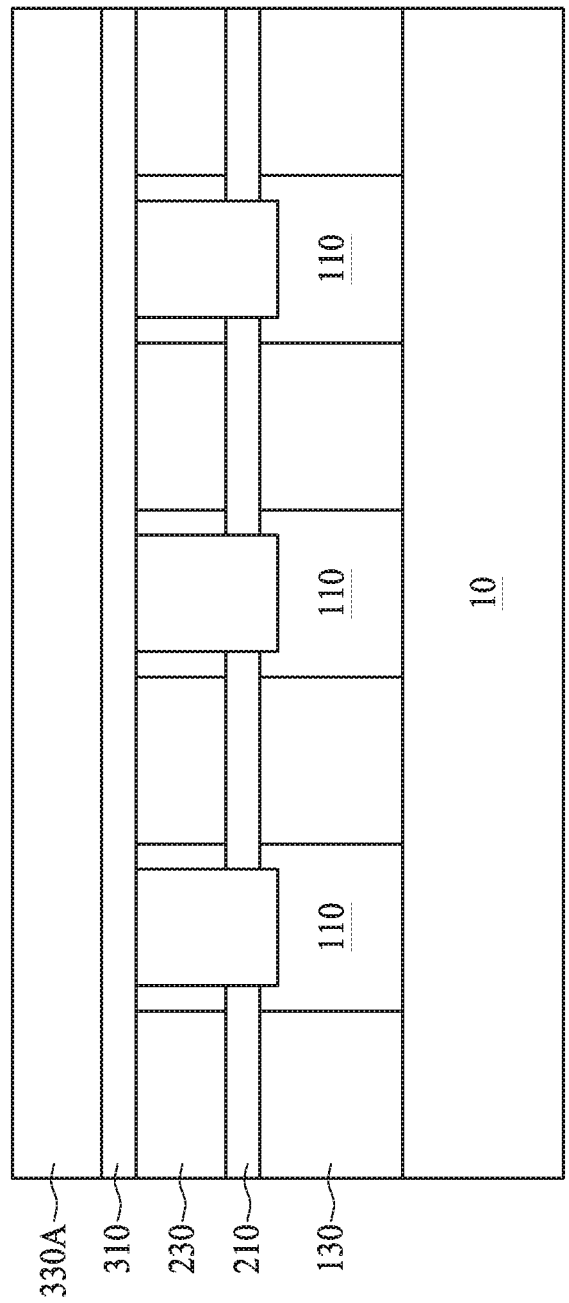

With reference to FIG. 19, a second stop layer 310 and a third dielectric layer 330A are formed on the top surface S2 according to step S125 in FIG. 3. In some embodiments, the second stop layer 310 may include the same material as the first stop layer 210. In some embodiments, the second stop layer 310 may serve as an etching stop layer to improve planarization. In some embodiments, the second stop layer 310 is thin, preferably less than 1000 Å (angstroms) thick, but the disclosure is not limited thereto. Still referring to FIG. 19, the third dielectric layer 330A is deposited to completely cover the second stop layer 310. In some embodiments, the third dielectric layer 330A may include the same material as the substrate 10. A CMP process is performed to planarize the third dielectric layer 330A prior to the subsequent process.

Figure 20:
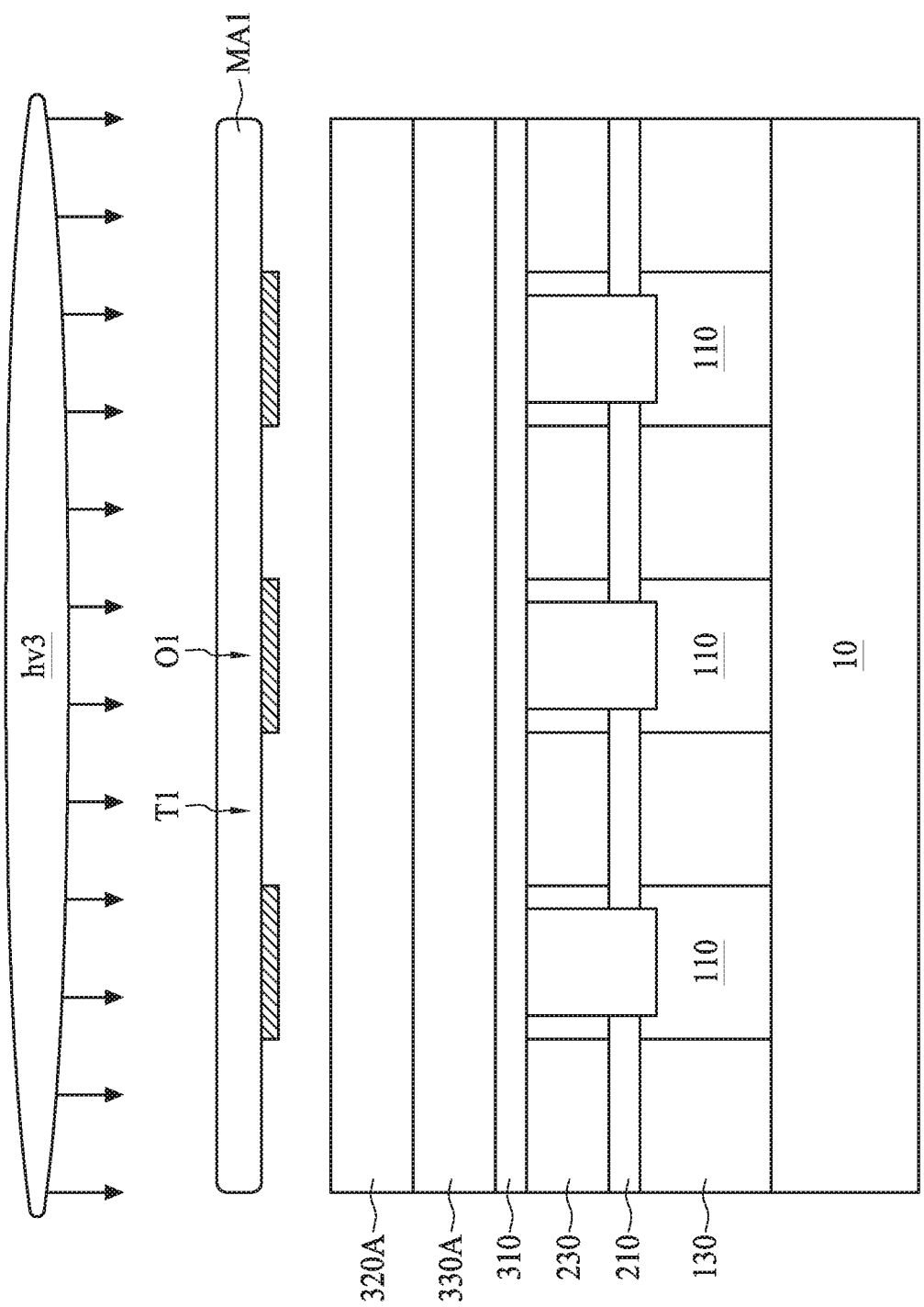
Figure 21:
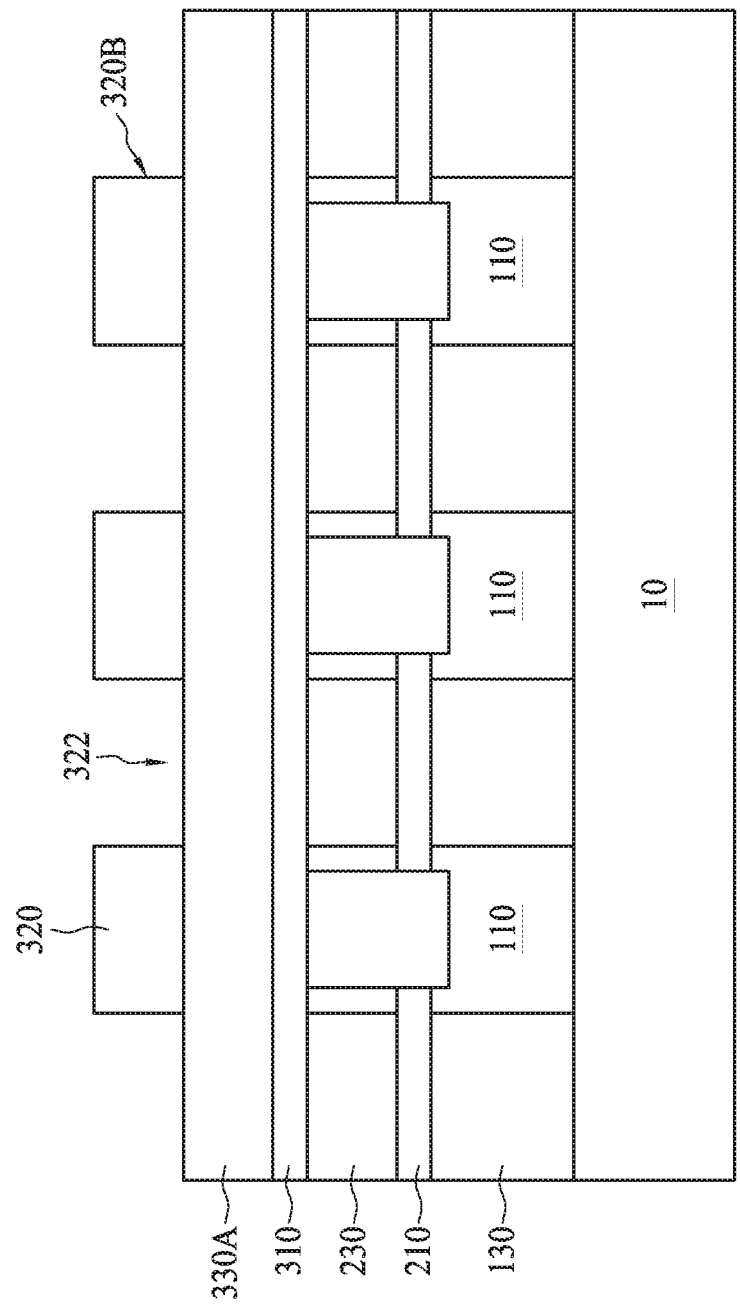

With reference to FIGS. 20 and 21, a third lithography process is performed according to step S127 in FIG. 3. First, referring to FIG. 20, a third photoresist layer 320A is deposited to completely cover the third dielectric layer 330A. Next, the third photoresist layer 320A is exposed to a third radiation hv3 using the first photomask MA1 and a lithography system. In some embodiments, the third radiation hv3 may include, but is not limited to, deep ultraviolet (DUV) light. The exposure induces a photochemical reaction that changes the chemical property of a portion of the third photoresist layer 320A. In some embodiments, a PEB process may be performed after the third photoresist layer 320A is exposed.

Subsequently, referring to FIG. 21, an appropriate developing solution is used to rinse the exposed third photoresist layer 320A. The exposed portion of the third photoresist layer 320A reacts with the developing solution and can be easily removed. After the developing process is finished, a third photoresist pattern 320B is formed on the third dielectric layer 330A. The third photoresist pattern 320B includes multiple third photoresist features 320 and multiple openings 322 arranged with the third photoresist features 320. In some embodiments, the third photoresist features 320 and the openings 322 respectively correspond to the first opaque portions O1 and the first transparent portions T1 of the first photomask MA1 shown in FIG. 20. Portions of the third dielectric layer 330A are covered by the third photoresist features 320.

Figure 22:
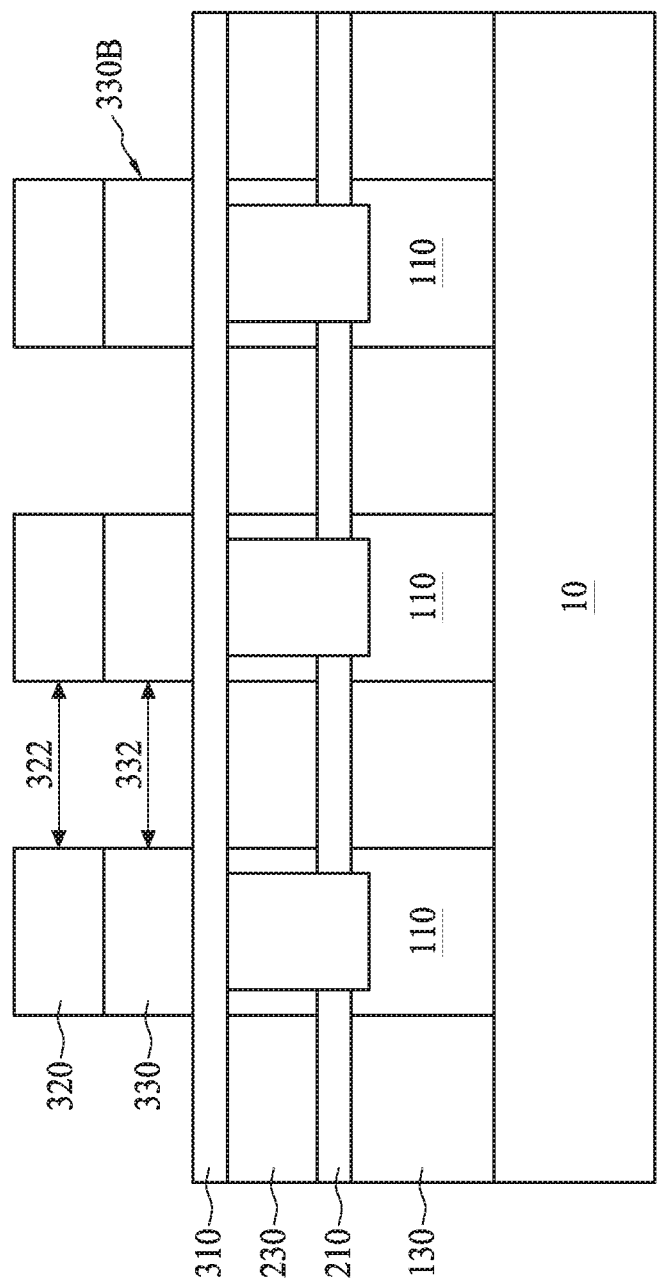

With reference to FIG. 22, a third etching process is performed according to step S129 in FIG. 3. In some embodiments, the third dielectric layer 330A is etched using the third photoresist pattern 320B, shown in FIG. 21, as an etching mask. Specifically, the uncovered portions of the third dielectric layer 330A are removed by a third etchant (not shown) to expose portions of the second stop layer 310. In some embodiments, the third etchant may be the same as the first etchant or the second etchant. As a result, a third dielectric layer 330B comprising multiple third dielectric features 330 and multiple openings 332 is formed on the second stop layer 310. In some embodiments, the third dielectric features 330 are connected to the third photoresist features 320 and the openings 332 communicate with the openings 322.

Figure 23:
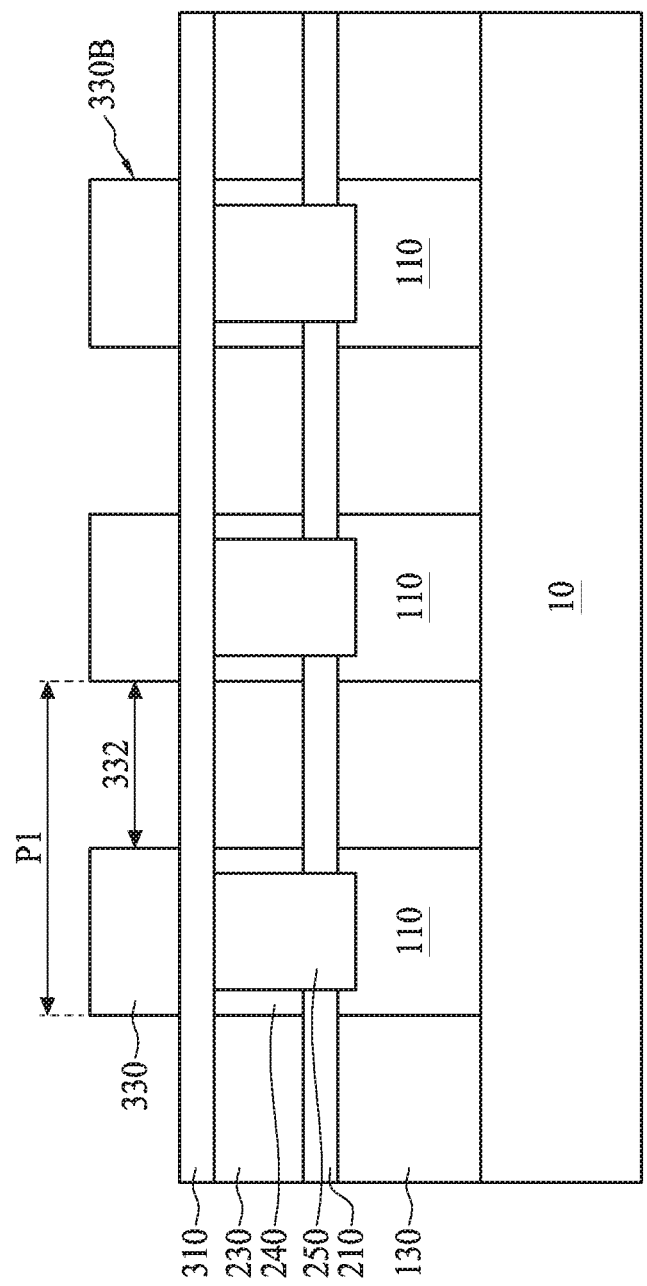

With reference to FIG. 23, a third photoresist removal process is performed according to step S131 in FIG. 3. After the third etching process is finished, the third photoresist pattern 320B may be removed. In some embodiments, the first pitch P1 exists in the third dielectric pattern 330B, wherein the first pitch P1 equals the distance from one of the third dielectric features 330 to an adjacent third dielectric feature 330 plus the width of the third dielectric feature because the third lithography process uses the first photomask MA1.

Figure 24:
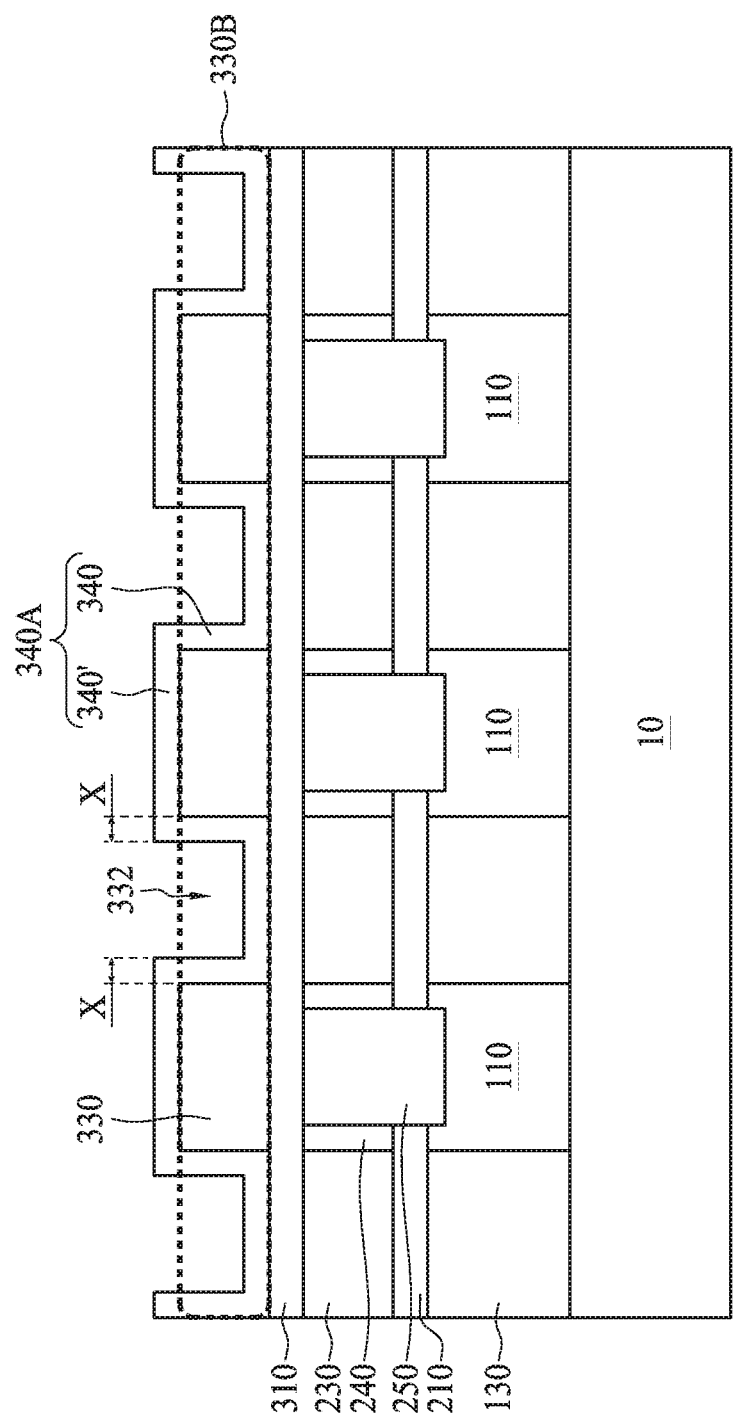

With reference to FIG. 24, a second spacer deposition is performed according to step S133 in FIG. 3. In some embodiments, a spacer layer 340A may be formed conformally on the third dielectric layer 330B and portions of the second stop layer 310 exposed through the third dielectric layer 330B. The spacer layer 340A can include a plurality of horizontal portions 340' covering top surfaces of the third dielectric features 330 and the portions of the second stop layer 310 not occupied by the third dielectric features 330, and a plurality of vertical portions 340 covering sidewalls of the third dielectric features 330. In some embodiments, the spacer layer 340A may be formed using a CVD process or an ALD process. In some embodiments, the spacer layer 340A has the same thickness X as the spacer layer 240A. In some embodiments, the spacer layer 340A can include the same material as the spacer layer 240A.

Figure 25:
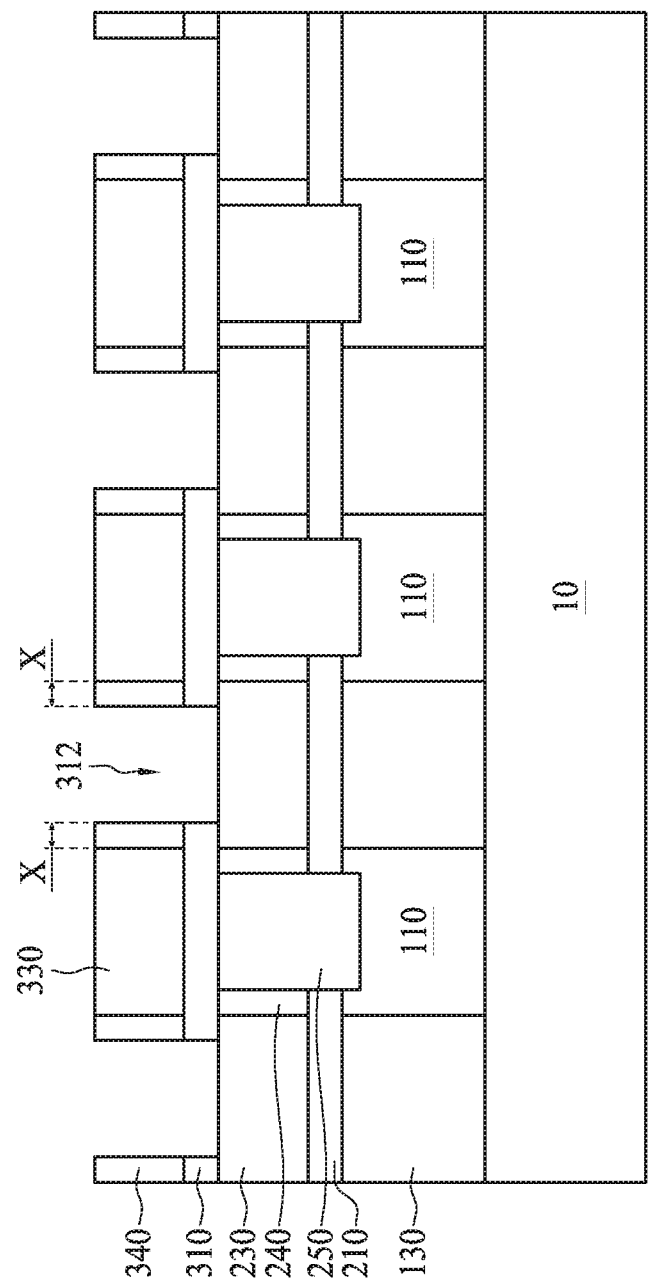

With reference to FIG. 25, a second spacer etching process is performed according to step S135 in FIG. 3. In some embodiments, the second spacer etching process is an anisotropic etching process that removes horizontal portions 340' of the spacer layer 340A, shown in FIG. 24, and portions of the second stop layer 310 not protected by the vertical portions 340 of the spacer layer 340A. As a result, multiple spacers 340 comprising the thickness X are left on the second stop layer 310 to cover sidewalls of the third dielectric features 330. During the second spacer etching, multiple openings 312, penetrating through the second stop layer 310, are formed to expose the second dielectric features 230. In some embodiments, portions of the second stop layer 310 are interposed between the spacers 340 and the second dielectric features 230, a portion of the second stop layer 310 is interposed between the third dielectric features 330 and the spacers 240, and the remaining portion of the second stop layer 310 is interposed between the third dielectric features 330 and the first conductive features 250.

Figure 26:
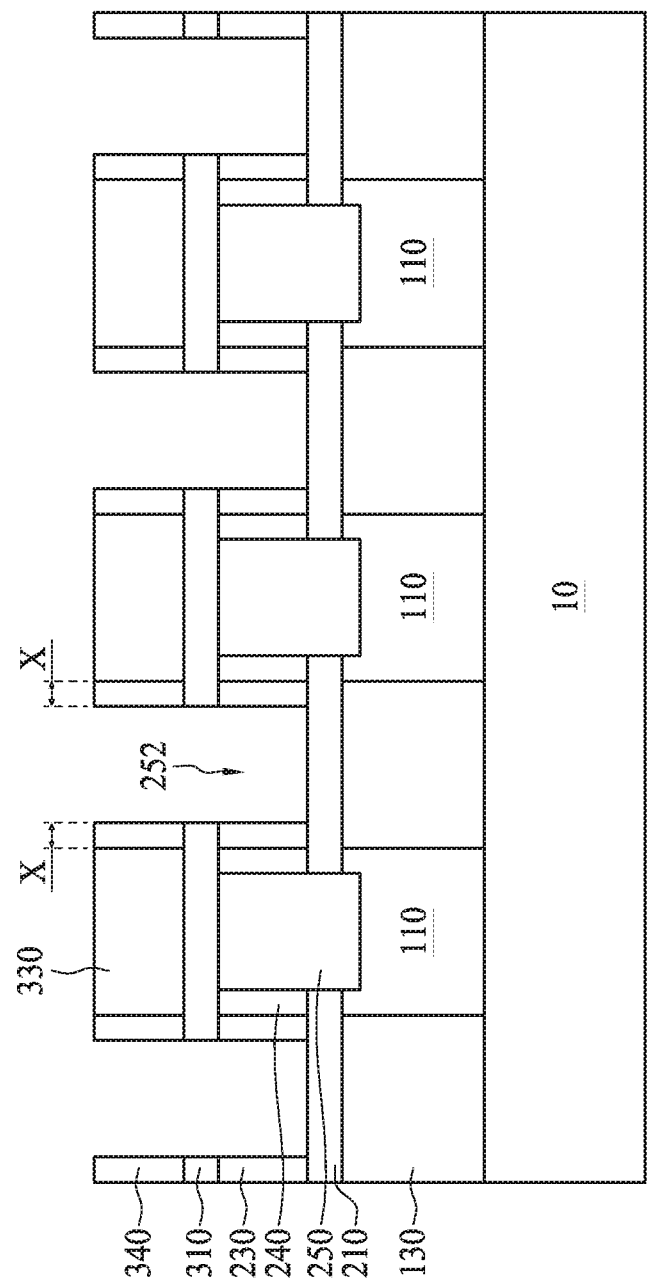

With reference to FIG. 26, a fourth etching process is performed according to step S137 in FIG. 3. In some embodiments, portions of the second dielectric features 230 exposed by the openings 312, shown in FIG. 25, are etched to expose the first stop layer 210. In some embodiments, the fourth etching process and the second spacer etching can be performed in a single step or in separate steps. In some embodiments, when the fourth etching process and the second spacer etching process are performed in separate steps, the etchant in the second spacer etching process can be properly chosen such that the spacer layer 340A and the second stop layer 310 have an etching rate greater than that of the second dielectric features 230. After the fourth etching process is finished, multiple openings 252 are formed to expose the first stop layer 210.

Figure 27:
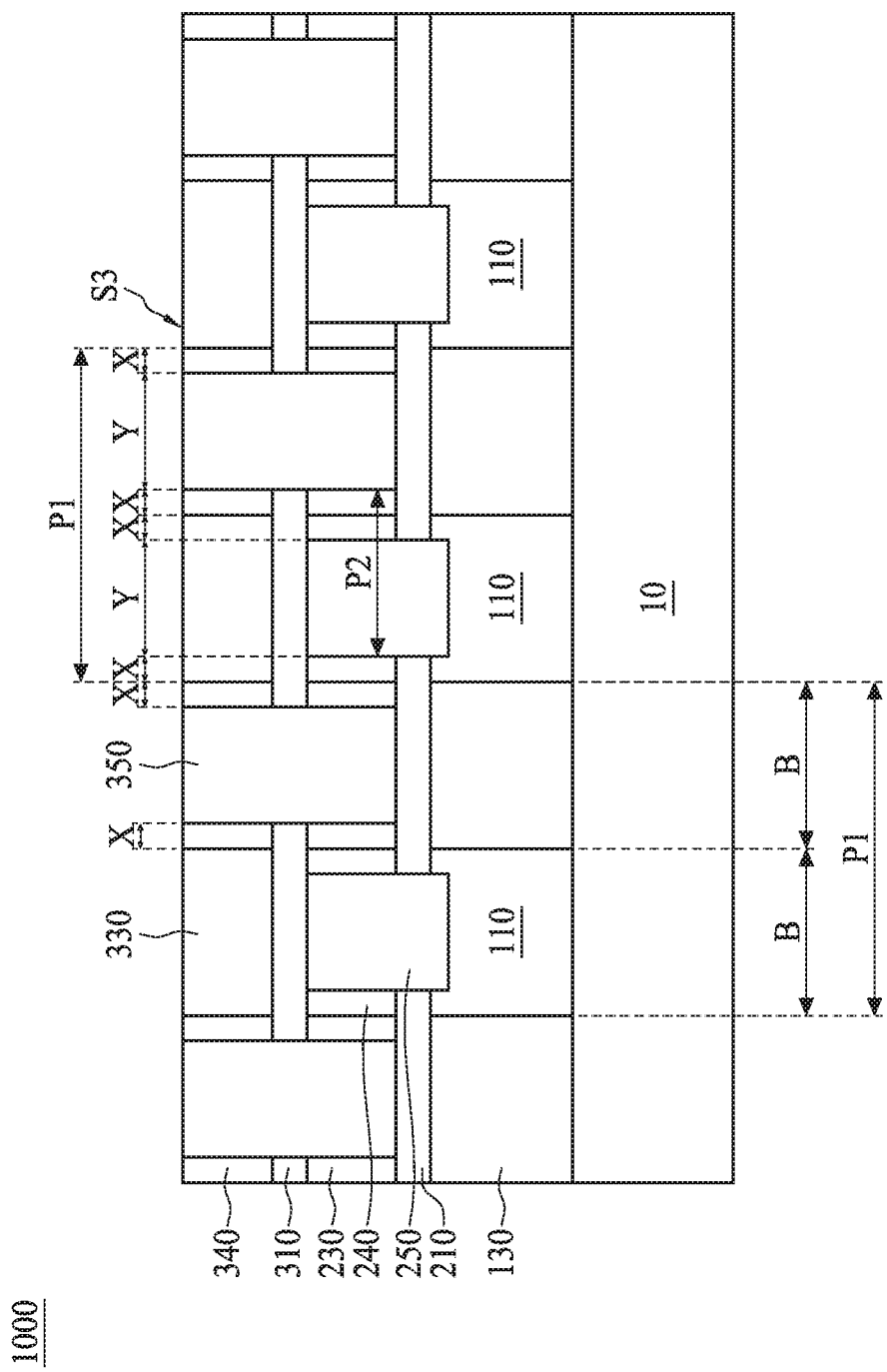

With reference to FIG. 27, a second conductive material deposition is performed according to step S139 in FIG. 3. In some embodiments, the second conductive material deposition is an electroplating process. Specifically, a second conductive material is deposited to fill the openings 252 and 312 and completely cover the third dielectric features 330 and the spacers 340. In some embodiments, the second conductive material may be the same as the first conductive material. After the openings 252 and 312 are completely filled with the second conductive material, a CMP process is performed to remove a portion of the second conductive material to expose the third dielectric features 330 and the spacers 340. At such time, multiple second conductive features 350 deposited in the openings 252 and 312 are formed and a semiconductor structure 1000 is generally formed. In some embodiments, the third dielectric features 330, the spacers 340 and the second conductive features 350 have coplanar top surfaces that form a planar top surface S3. In some embodiments, before the second conductive material is deposited, a diffusion barrier layer (not shown) may be conformally formed in the openings 252 and 312. The diffusion barrier layer, which lines the openings 252 and 312, functions as an isolation to prevent metal diffusion and as an adhesion layer between the second conductive material and dielectric materials. After the diffusion barrier layer is formed, a seed layer (not shown) is formed on the diffusion barrier layer. In some embodiments, when the second conductive material is a copper-containing material, the seed layer may be a copper seed layer formed by a PVD process.

Still referring to FIG. 27, in some embodiments, a portion of each second conductive features 350 is surrounded by the spacers 340. In addition, the spacer 340 may be used as a hard mask to control the width of the openings 252 and 312 according to the thickness X of the spacer 340. Therefore, the thickness X of the spacer 340 may be used to adjust the width of the second conductive feature 350. For example, as shown in FIG. 27, the width of the second conductive feature 350 is equal to (B−2X), which is also equal to the width Y of the first conductive feature 250. In some embodiments, a second pitch P2 exists in the semiconductor structure 1000, wherein the second pitch P2 equals the distance from one of the first conductive features 250 to a nearest second conductive feature 350 plus the width of one of the first or second conductive features 250 or 350. In some embodiments, the second pitch P2 is equal to the width Y of the first conductive feature 250 or the second conductive feature 350 plus two times the thickness X of the spacer 240 or the spacer 340, that is P2=(2X+Y). Because P1=2B and B=(2X+Y), P1=2P2. As a result, the second pitch P2 is half of the first pitch P1.

Interconnect structures with tight pitches are difficult to fabricate, especially when the pitch is less 75 nm. The present disclosure provides a multi-patterning method that can drive the pitch of a semiconductor structure down and fabricate a tight-pitch semiconductor structure. The present disclosure uses a first photomask in the first and third lithography processes and a second photomask, which is reverse-tone to the first photomask, in the second lithography process. In addition, the present disclosure uses spacers as a hard mask and controls the thickness of the spacers to adjust the width of conductive features. Therefore, given the pitch defined by two proximal main features, e.g., gate structures, the final pitch, which is defined by two proximal conductive features, e.g., metal lines, can be halved, resulting in a reduced minimum feature size.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
   a substrate;
   a dielectric layer disposed on the substrate;
   at least one main feature disposed in the dielectric layer and contacting the substrate;
   at least one first conductive feature disposed in the dielectric layer and on the at least one main feature;
   at least one first spacer interposed between the dielectric layer and a portion of the at least one first conductive feature;
   a plurality of second conductive features disposed in the dielectric layer and on either side of the at least one first conductive feature; and
   a plurality of second spacers interposed between the dielectric layer and portions of the second conductive features;
   wherein the dielectric layer comprises a plurality of first dielectric features on the substrate and on either side of the at least one main feature, wherein a first pitch equals the distance between centerlines of two adjacent first dielectric features, a second pitch equals the distance from one of the at least one first conductive feature to a nearest second conductive feature plus a width of one of the first or second conductive features, and the second pitch is half of the first pitch.

2. The semiconductor structure of claim 1, wherein the at least one first conductive feature is centrally positioned on the at least one main feature.

3. The semiconductor structure of claim 1, wherein the first dielectric features and the at least one main feature have an identical first width, which is equal to half of the first pitch.

4. The semiconductor structure of claim 1, further comprising a first stop layer covering the first dielectric features and a portion of the at least one main feature, wherein the first stop layer surrounds portions of the at least one first conductive feature, and the at least one first spacer is located on the first stop layer and covers portions of the at least one first conductive feature above the first stop layer.

5. The semiconductor structure of claim 4, wherein the dielectric layer further comprises a plurality of second dielectric features on the first stop layer.

6. The semiconductor structure of claim 5, wherein the second dielectric features, the at least one first spacer and the at least one first conductive feature have coplanar top surfaces that form a first planar top surface.

7. The semiconductor structure of claim 6, further comprising a second stop layer on the first planar top surface, wherein portions of the second conductive features are surrounded by the second stop layer.

8. The semiconductor structure of claim 7, wherein the dielectric layer further comprises a plurality of third dielectric features on the second stop layer.

9. The semiconductor structure of claim 8, wherein the second spacers are located on the second stop layer and cover sidewalls of the third dielectric features.

10. The semiconductor structure of claim 9, wherein the third dielectric features, the second spacers and the second conductive features have coplanar top surfaces that form a second planar top surface.

11. The semiconductor structure of claim 1, wherein the at least one first conductive feature extends into the at least one main feature.

12. The semiconductor structure of claim 1, wherein the at least one first spacer and the second spacers have identical thicknesses.

13. The semiconductor structure of claim 1, wherein the at least one first conductive feature and the second conductive features have an identical width.

* * * * *